United States Patent
Jung et al.

(10) Patent No.: US 11,855,622 B2
(45) Date of Patent: *Dec. 26, 2023

(54) TOUCH SENSING DEVICE AND ELECTRONIC DEVICE INCLUDING TOUCH SENSING DEVICE

(71) Applicant: SAMSUNG ELECTRO-MECHANICS CO., LTD., Suwon-si (KR)

(72) Inventors: Mun Sun Jung, Suwon-si (KR); Gye Won Lee, Suwon-si (KR); Jong Yun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 410 days.

This patent is subject to a terminal disclaimer.

(21) Appl. No.: 17/329,523

(22) Filed: May 25, 2021

(65) Prior Publication Data
US 2022/0077855 A1   Mar. 10, 2022

(30) Foreign Application Priority Data

Sep. 7, 2020 (KR) .......................... 10-2020-0113949
Dec. 9, 2020 (KR) .......................... 10-2020-0171391
Apr. 5, 2021 (KR) .......................... 10-2021-0044156

(51) Int. Cl.
*H03K 17/96* (2006.01)
*G06F 3/044* (2006.01)
*G06F 3/02* (2006.01)

(52) U.S. Cl.
CPC ............. *H03K 17/962* (2013.01); *G06F 3/02* (2013.01); *G06F 3/044* (2013.01); *H03K 17/9625* (2013.01); *G06F 2203/04105* (2013.01)

(58) Field of Classification Search
None
See application file for complete search history.

(56) References Cited

U.S. PATENT DOCUMENTS 11,526,236 B2 *  12/2022  Chang ................... H03K 17/97
2017/0269754 A1 *  9/2017  Liu ....................... G06F 3/0444
2017/0359063 A1 *  12/2017  Oberhauser .......... H03K 17/962
2018/0081221 A1 *  3/2018  Liu ......................... H03K 17/96
2018/0260050 A1 *  9/2018  Unseld ................ G06F 3/04166
2019/0187856 A1 *  6/2019  Bruwer ................... G06F 3/046
2020/0166378 A1    5/2020  Ji et al.

FOREIGN PATENT DOCUMENTS

JP   2002-195903 A    7/2002
KR   10-1724016 B1    4/2017
KR   10-2115524 B1    5/2020

* cited by examiner

*Primary Examiner* — Fred Tzeng
(74) *Attorney, Agent, or Firm* — NSIP Law

(57) ABSTRACT

A touch sensing device includes: a force sensing unit including a sensing coil; and a metal portion. At least a portion of the metal portion is in contact with the force sensing unit, and the touch sensing device is configured such that a region of the metal portion overlapping with the sensing coil changes in response to a touch being applied to the touch sensing device.

33 Claims, 14 Drawing Sheets

TOUCH SENSING DEVICE AND ELECTRONIC DEVICE INCLUDING TOUCH SENSING DEVICE

CROSS-REFERENCE TO RELATED APPLICATIONS

This application claims the benefit under 35 U.S.C. § 119(a) of Korean Patent Application Nos. 10-2020-0113949, 10-2020-0171391, and 10-2021-0044156, filed on Sep. 7, 2020, Dec. 9, 2020, and Apr. 5, 2021, respectively, in the Korean Intellectual Property Office, the entire disclosures of which are incorporated herein by reference for all purposes.

BACKGROUND

1. Field

The following description relates to a touch sensing device and an electronic device including a touch sensing device.

2. Description of Related Art

In general, a wearable device having a lower thickness and a simple and tidy design is preferred, and accordingly, existing mechanical switches are being eliminated from wearable devices. The realization of a wearable device without mechanical switches has become possible with the implementation of dustproof and waterproof technologies and the development of products having a sleek and integral design.

Currently, a touch-on-metal (ToM) technology in which a metal is touched, a capacitor sensing technique using a touch panel, a micro-electro-mechanical-system (MEMS), a micro strain gauge technology, and the like have been developed, and even a force touch function has been developed.

An existing mechanical switch has a large inner size and requires a large amount of space in order to implement a switch function. Additionally, the existing mechanical switch protrudes to the outside of a wearable device and has a structure that is not integrated with an external case of the wearable device, which causes disadvantages such as a non-sleek design and the use of excessive space.

Further, there may be a danger of a user receiving an electric shock due to a direct contact with an electrically connected mechanical switch, and, particularly, it is difficult to implement protection against dust and water due to the structure of the mechanical switch.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a touch sensing device includes: a force sensing unit including a sensing coil; and a metal portion. At least a portion of the metal portion is in contact with the force sensing unit, and the touch sensing device is configured such that a region of the metal portion overlapping with the sensing coil changes in response to a touch being applied to the touch sensing device.

Either one or both of a position and a size of a contact region between the metal portion and the force sensing unit may be changed in response to the touch being applied.

The metal portion may be configured to be deformed according to pressure intensity of an applied touch.

The touch sensing device may further include: a board having a space in which the sensing coil is disposed; and a bracket supporting the board and the metal portion.

At least one end of the metal portion may be connected to the bracket. Another end of the metal portion may be in contact with the force sensing unit. The other end of the metal portion may be configured to move in a horizontal direction on one surface of the force sensing unit, in response to the touch being applied.

The metal portion may include: an inclined portion connected to the bracket and having a predetermined inclination with respect to the board; a pressing portion connected to the inclined portion and protruding in a direction away from the sensing coil; and a contact portion connected to the pressing portion and disposed in contact with one surface of the force sensing unit.

The metal portion may include: a cover portion disposed to be spaced apart from the sensing coil and configured to move toward the sensing coil in response to the touch being applied; a plurality of protruding portions protruding from opposite sides of the cover portion and coupled to the bracket; and an elastic portion including one end connected to the cover portion, and another end disposed in contact with the force sensing unit. The touch sensing device may be configured such that a position of a region of the elastic portion in contact with the force sensing unit changes in response to the cover portion moving.

The metal portion may include: a plurality of support portions disposed in contact with the bracket, and configured to move on the bracket in response to the touch being applied; and a head portion disposed between the plurality of support portions, and disposed in contact with the force sensing unit. The touch sensing device may be configured such that a size of a region of the head portion in contact with the force sensing unit changes in response to the support portions moving.

The touch force sensing unit may be configured to move in a direction in which a touch is applied, according to pressure intensity of the applied touch.

The touch sensing device may further include: a board having a first surface on which the force sensing unit is disposed and a second surface perpendicular to the first surface; and a bracket supporting the board. The metal portion may be disposed parallel to the first surface, and the touch sensing device may be configured such that a size of the region of the metal portion overlapping with the sensing coil changes in response to the force sensing unit moving.

The force sensing unit may further include a protection member disposed to cover the sensing coil and having one surface in contact with the metal portion.

The touch sensing device may further include a pad disposed to contact a housing and configured to sense a change in capacitance in response to an external contact being applied to the touch switch.

The pad may form a first resonant circuit, and the sensing coil may form a second resonant circuit. The first and second resonant circuits may be configured to generate first and second resonance signals, respectively, having first and second resonant frequencies, respectively, changing as the touch is applied.

The touch sensing device may further include a detection circuit electrically connected to the first resonant circuit and the second resonant circuit. The detection circuit may be configured to generate a contact touch input signal based on an amount of change in resonant frequency of the first resonance signal, and generate a force touch input signal based on an amount of change in resonant frequency of the second resonance signal.

In another general aspect, an electronic device includes: a housing including a touch switch portion; and a touch sensing device configured to sense either one or both of a force touch and a contact touch, in response to a touch being applied to the touch switch portion. The touch sensing device includes: a force sensing unit including a sensing coil; a metal portion, at least a portion of the metal portion being in contact with the force sensing unit, and the touch sensing device being configured such that a region of the metal portion overlapping the sensing coil changes in response to the touch being applied to the touch switch portion; and a bracket disposed to be spaced apart from the housing, and supporting the force sensing unit and the metal portion such that the metal portion is disposed between the housing and the bracket.

The metal portion may be configured to be deformed by pressure of the applied touch being transferred from the housing. The touch sensing device may be configured such that either one or both of a position and a size of a contact region between the metal portion and the force sensing unit is changed by the pressure of the applied touch.

One region of the metal portion may be in contact with the housing. Another region of the metal portion may be in contact with the force sensing unit. The other region of the metal portion may be configured to move in a horizontal direction on one surface of the force sensing unit, in response to the pressure of the applied touch being transferred to the one region.

The metal portion may include: a pressing portion protruding to be in contact with the housing, and configured to be deformed by the pressure of the applied touch being transferred from the housing; an inclined portion having opposite ends connected to one end of the pressing portion and the bracket, respectively, and configured to have an inclination changed in response to the pressing portion being deformed; and a contact portion having one end connected to the other end of the pressing portion, having another end disposed in contact with the force sensing unit, and configured to move in a horizontal direction on one surface of the force sensing unit in response to the pressing portion being deformed.

The metal portion may include: a cover portion having an upper surface portion in contact with the housing, and side surface portions extending on opposite sides of the upper surface portion in a vertical direction, and configured to descend due to the pressure of the applied touch being transferred from the housing; a plurality of protruding portions protruding from the side surface portions of the cover portion and coupled to the bracket; and an elastic portion having one end connected to the upper surface portion, another end in contact with the force sensing unit. The touch sensing device may be further configured such that a position of a region of the elastic portion that is in contact with the force sensing unit changes in response to the cover portion descending.

The force sensing unit may be disposed between the housing and the metal portion. The touch sensing device may be further configured such that the size of the contact region between the metal portion and force sensing unit changes in response to the pressure of the applied touch being transferred from the housing to the force sensing unit.

The touch sensing device may further include a board having a first surface on which the force sensing unit is disposed and disposed perpendicular to the housing, and a second surface in contact with the housing and disposed parallel to the housing. The metal portion may be disposed parallel to the first surface of the board. The touch sensing device may be further configured such that a size of an overlapping region between the force sensing unit and the metal portion may change in response to the board descending due to the pressure of the applied touch being transferred from the housing.

The touch sensing device may further include a pad in contact with the housing, and configured to sense a capacitance change caused by an external contact on the touch switch portion.

The pad and the sensing coil may be disposed on a same board, and may be connected to each other to form a resonant circuit.

The pad may form a first resonant circuit, and the sensing coil may form a second resonant circuit. The first and second resonant circuits may be configured to generate first and second resonance signals, respectively, having first and second resonant frequencies, respectively, changing in response to the touch being applied.

The electronic device may further include a detection circuit electrically connected to the first resonant circuit and the second resonant circuit. The detection circuit may be configured to generate a contact touch input signal based on an amount of change in resonant frequency of the first resonance signal, and generate a force touch input signal based on an amount of change in resonant frequency of the second resonance signal.

In another general aspect, a touch sensing device includes: a force sensing unit including a sensing coil; and a conductive member configured to deform, in response to a touch being applied to the touch sensing device, such that the conductive member moves in a first direction perpendicular to a sensing surface of the force sensing unit, and a second direction parallel to the sensing surface.

The conductive member may include: a pressing portion configured to be move in the first direction, in response to pressure transferred from the applied touch; and a contact portion in contact with the sensing surface and configured to move in the second direction on the sensing surface, in response to the pressing portion moving in the first direction.

The contact portion may be disposed at one end of the conductive member. The conductive member may further include an inclined portion connecting the contact portion to the pressing portion.

The touch sensing device may be configured such that a region in which the conductive portion and the force sensing unit overlap changes due to the deforming of the conductive member.

In another general aspect, an electronic device includes: a housing including a touch switch portion; and a touch sensing device configured to sense a touch applied to the touch switch portion. The touch sensing device includes: a bracket disposed inside the housing; a force sensing unit disposed on the bracket, inside the housing, and including a sensing coil; and a conductive member disposed inside the housing and configured to deform, in response to the applied touch, such that the conductive member moves in a first direction perpendicular to a sensing surface of the force sensing unit, and a second direction parallel to the sensing surface.

The conductive member may include: a pressing portion configured to be contacted by the housing and move in the first direction, in response to pressure transferred through the housing from the applied touch; and a contact portion in contact with the sensing surface and configured to move in the second direction on the sensing surface, in response to the pressing portion moving in the first direction.

The contact portion may be disposed at one end portion of the conductive member. Another end portion of the conductive member may be fixed on a surface of the bracket.

The conductive member may include: a cover portion including an upper portion configured to be contacted by the housing to move the cover portion in the first direction, in response to pressure transferred through the housing from the applied touch, and side portions movably coupled to extended portions of the bracket; and an elastic portion having a first end connected to the cover portion, and a second end in contact with the sensing surface, the second end being configured to move in the second direction along the sensing surface, in response to the cover portion moving in the first direction.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
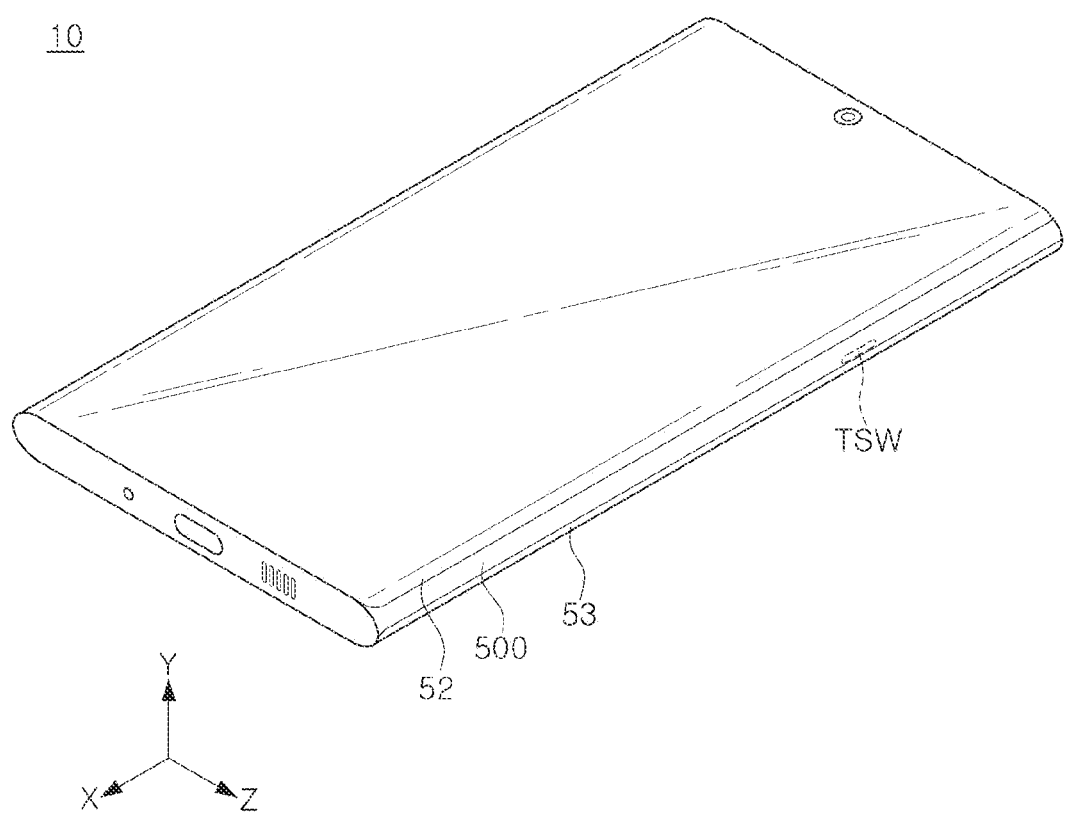
FIG. 1 is a perspective view illustrating an electronic device to which a touch sensing device, according to an embodiment, is applied.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is to be noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape occurring during manufacturing.

The features of the examples described herein may be combined in various manners as will be apparent after gaining an understanding of the disclosure of this application. Further, although the examples described herein have a variety of configurations, other configurations are possible as will be apparent after gaining an understanding of the disclosure of this application.

Generally, in a case in which, instead of a mechanical switch, a touch sensor is used in an electronic device, a touch input signal is generated according to a change in interval between a metal housing (or frame) and a sensing coil. That is, when the interval between the housing and the sensing coil is changed due to a touch applied to the housing, the touch input signal is generated only in a case in which the degree of change exceeds a preset threshold.

Further, using a principle that the degree of change in interval (e.g., spacing) between the housing and the sensing coil varies depending on a pressure intensity of the touch applied to the housing, various touch inputs may be distinguished and sensed according to a magnitude of a force applied by a user.

However, in order to sense a touch input using the change in interval between the housing and the sensing coil as described above, the housing and the sensing coil are required to be spaced apart from each other by a predetermined distance. Since it is necessary to sufficiently secure the distance between the housing and the sensing coil, an internal space of the electronic device including the touch sensor may not be efficiently utilized, which is problematic.

Moreover, a housing or central frame of an electronic device including a touch switch is required to be formed of a metal material in order to generate a touch input signal when the user performs an operation of pressing the touch switch. Accordingly, there is a limitation in the type of the electronic device into which the touch sensor may be inserted for installation, and in which the touch sensor may be used.

The following embodiments address the aforementioned problems. For example, a touch sensing device that senses a touch input includes a metal portion, and sensing is performed according to a change of an overlapping region between the metal portion and a sensing coil.

For example, even when the distance between the metal portion and the sensing coil is maintained constant, in a case in which at least one of the metal portion or the sensing coil moves in a horizontal direction (that is, a direction perpendicular to a winding shaft of the sensing coil), a size and characteristic of the overlapping region between the metal portion and the sensing coil may be changed.

Further, even in a state in which the distance between the metal portion and the sensing coil is "0", that is, a state in which the metal portion and the sensing coil are at least partially in contact with each other, a position and size of the contact region, and the like, may be changed as the metal portion is deformed by applied pressure.

The drawings according to the embodiments disclosed herein, which will be described below, illustrate various structures of a touch sensing device that make use of a change in a characteristic such as a position or a size of the overlapping region between the metal portion and the sensing coil. With such structures, the distance between the housing and the sensing coil need not be long, and the internal space of the electronic device may be efficiently utilized.

In addition, according to various exemplary embodiments disclosed herein, when pressure is applied to the metal portion, a contact region between a part of the metal portion and the sensing coil and a distance between another part of the metal portion and the sensing coil may be changed at the same time. In this case, a change amount sensed by the touch sensing device is larger as compared with a magnitude of the pressure applied by the user, and thus sensitivity is improved.

In this disclosure, a touch or application of a touch is a concept including a contact touch that does not involve a force and a force touch that is made by applying a force (pressure). Therefore, a touch input that generates an input signal for the electronic device may include a contact touch input that generates an input signal by a capacitive sensing method, and/or a force touch input that generates an input signal by an inductive sensing method.

Further, the contact touch input and the force touch input may be sensed at the same time in one touch operation performed by the user. That is, in a case in which the user applies a touch on a touch switch portion of the electronic device to generate external pressure, the contact touch and the force touch may be made on the touch switch portion at the same time.

According to an additional embodiment, which will be described in more detail later, the touch sensing device may include both a pad for sensing the contact touch, and a sensing coil for sensing the force touch, and in this case, the touch sensing device may perform hybrid sensing in which both capacitive sensing and inductive sensing are possible.

Hereinafter, for the respective drawings, an unnecessary overlapping description of components indicated by the same reference numerals and having the same functions may be omitted, and differences between the respective drawings may be described.

FIG. 1 is a perspective view illustrating an electronic device 10 to which a touch sensing device, according to an embodiment, is applied.

Referring to FIG. 1, the electronic device 10 may include, for example, a housing 500, a front display glass 52, a rear cover 53, and a touch switch portion TSW.

The housing 500 is a member for covering at least a partial region of the electronic device 10, and at the same time, may be formed integrally with a member for forming a main framework of the electronic device 10. The housing 500 may be formed of various conductive or non-conductive materials depending on the type and configuration of the electronic device 10.

The front display glass 52 may be disposed on one side of the housing 500, and the rear cover 53 may be disposed on another side of the housing 500 opposite to the one side of the housing. That is, the electronic device 10 may have a two-layered or three-layered side surface including the front display glass 52, the housing 500, and the rear cover 53.

The touch switch portion TSW may be formed in the side surface of the electronic device 10, and may replace a mechanical button. The touch switch portion TSW may be a portion to which a touch input is applied, that is, a contact surface to which pressure is applied by a user's hand. Further, referring to FIG. 1, the touch switch portion TSW may correspond to at least a partial region of the housing 500.

The electronic device 10 may be, but is not limited to, a portable device such as a smartphone, or a wearable device such as a smartwatch. The electronic device 10 may be an electronic device that is portable or wearable, or an electronic device having a switch for an operation control.

For example, the electronic device 10 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like, but is not limited thereto.

Figure 2A:
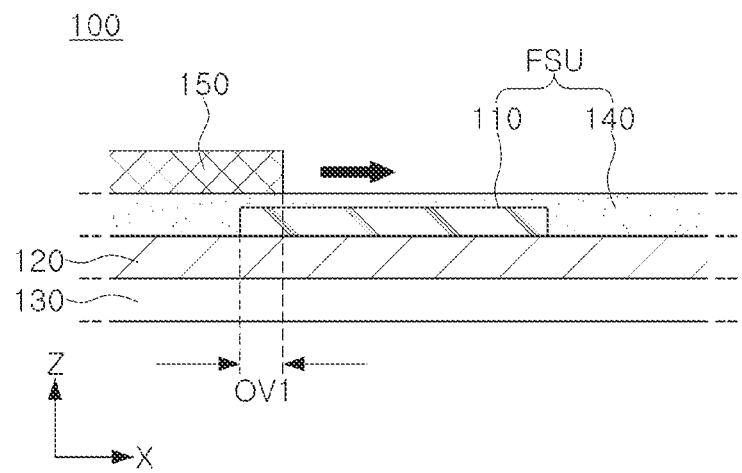
FIGS. 2A and 2B are front views in an X-Z plane, schematically illustrating a method of implementing a touch sensing device, according to an embodiment.
Figure 2B:
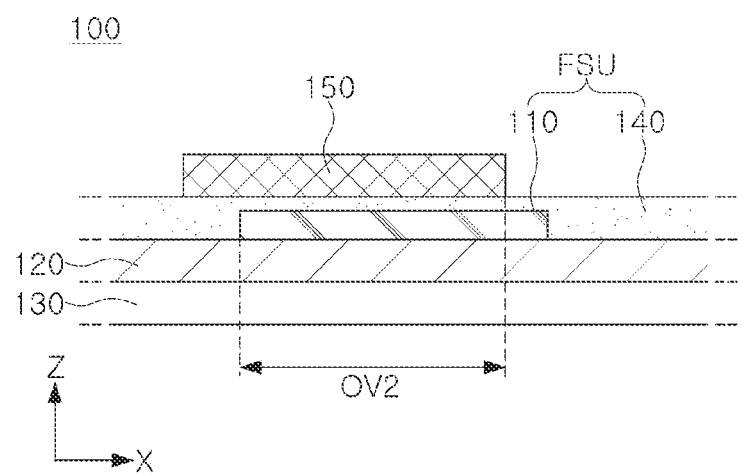
Figure 3:
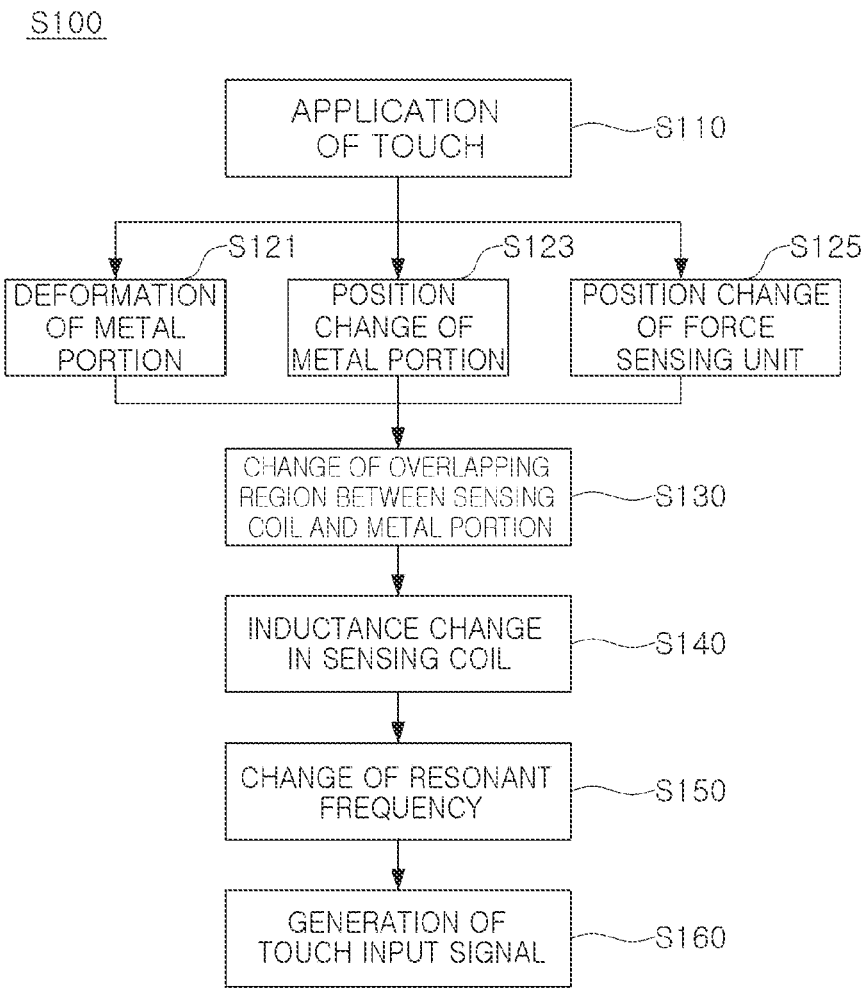
FIG. 3 is a schematic flowchart illustrating the method of implementing the touch sensing device of FIGS. 2A and 2B, according to an embodiment.

FIGS. 2A and 2B are front views in an X-Z plane, schematically illustrating a method of implementing a touch sensing device 100, according to an embodiment. FIG. 3 is a schematic flowchart describing the method of implementing the touch sensing device 100 of FIGS. 2A and 2B.

Referring to FIGS. 1 through 3, the electronic device 10 includes the touch sensing device 100, which senses a force touch or a contact touch when a touch is applied to the touch switch portion TSW. For example, the touch sensing device 100 may be installed by being inserted into the electronic device 10.

Although an example in which one touch sensing device 100 is disposed in the electronic device 10 is described herein, the following description may also be applied to an example in which a plurality of touch sensing devices 100 are installed in the electronic device 10. That is, one or more touch sensing devices 100 may be installed in the electronic device 10, as needed.

The plurality of touch sensing devices 100 generally correspond to different touch switch portions TSW and may perform different button functions, respectively. However, the plurality of touch sensing devices 100 may also correspond to one touch switch portion TSW and may perform a function of improving sensitivity of a sensor.

Referring to FIGS. 2A and 2B, the touch sensing device 100 according to an exemplary embodiment in the present disclosure includes a force sensing unit FSU including a sensing coil 110, and a metal portion (or conductive member) 150. A region of the metal portion 150 that overlaps with the sensing coil 110 is changed when a touch is applied.

As illustrated in FIG. 2A, the touch sensing device 100 may further include a board 120 and a bracket 130. Further, the force sensing unit FSU included in the touch sensing device 100 may further include a protection member 140 disposed to cover the sensing coil 110.

The force sensing unit FSU may be disposed on the board 120 and supported by the bracket 130. The force sensing unit FSU may include the sensing coil 110 and may perform "inductive sensing" together with the metal portion 150. That is, the force sensing unit FSU and the metal portion 150 are components capable of sensing a force touch input among components of the touch sensing device 100.

The force sensing unit FSU has one surface that comes into contact with the metal portion 150. As the metal portion 150 moves or is deformed while being in contact with the force sensing unit FSU, the inductance of the sensing coil 110 included in the force sensing unit FSU is changed.

Such an inductance change induces a change in resonant frequency of a resonance signal generated in the touch sensing device 100, and the touch sensing device 100 may determine, based on the change of the resonant frequency, that the force touch input is applied to the touch switch portion TSW.

The sensing coil 110 may be a winding type coil, and a shape of the winding type coil is not particularly limited. Although the drawings of this disclosure illustrate a rectangular coil, the coil may be formed in various shapes, such as a circular shape and a track shape. In addition, the sensing coil 110 may also be implemented by forming a wiring pattern on a printed circuit board (PCB) or a flexible printed circuit board (FPCB), or including a chip inductor.

The sensing coil 110 has an inductance that varies when a force touch is applied. For example, a size of a contact region between the metal portion 150 and the force sensing unit FSU may be changed when the metal portion 150 moves due to an applied touch, and as a result, a size of an overlapping region between the sensing coil 110 included in the force sensing unit FSU and the metal portion 150 may be changed. As an example, the size of the overlapping region may be increased from OV1 to OV2 as illustrated in FIGS. 2A and 2B.

A current flows in the sensing coil 110, and an intensity of an eddy current is changed due to the change of the size of the overlapping region between the sensing coil 110 and the metal portion 150, which is a conductor present in the vicinity of the sensing coil 110. Further, the inductance of the sensing coil 110 is increased or decreased (L±ΔL) by the changed eddy current. The touch sensing device 100 may perform inductive sensing in which such an inductance change is sensed to determine whether a touch input is applied.

The board 120 may have a space in which the sensing coil 110 is disposed, and may be supported by the bracket 130. The board 120 may further have a space in which a pad to be described later is disposed. The sensing coil 110 and the board 120 in which the pad is mounted may be formed independently of each other or may be formed as one board 120.

The board 120 may correspond to a FPCB, but is not limited thereto. That is, in addition to the FPCB, various types of boards having a structure in which at least one metal layer and at least one wiring layer are alternately stacked may be used.

The bracket 130 may support the board 120 and the metal portion 150. That is, the basic structure of the touch sensing device 100 may be maintained by the bracket 130 in a state in which a touch is not applied.

A part of the metal portion 150 may be fixed to the bracket 130 or may be coupled to be movable within a predetermined range. Therefore, when external pressure is applied and then removed, the metal portion 150 may be restored to an original position or original shape even after the metal portion 150 moves or is deformed.

Further, as illustrated in FIGS. 5 and 7, for example, to be described later, the bracket 130 may be disposed to be spaced apart from the housing 500, and may support the force sensing unit FSU and the metal portion 150 such that the force sensing unit FSU and the metal portion 150 are disposed between the bracket 130 and the housing 500. That is, an outermost framework of the touch sensing device 100 is formed by the bracket 130, such that the touch sensing device 100 may be stably inserted into and installed in the electronic device 10.

The bracket 130 may be formed of a conductive material such as a metal, but is not limited to being formed of a metal. A material of the bracket 130 is not particularly limited, as long as the bracket 130 may stably support the structure of the touch sensing device 100.

The protection member 140 may be disposed to cover the sensing coil 110 and may have one surface that is contact with the metal portion 150. That is, for example, the protection member 140 is disposed between the sensing coil 110 and the metal portion 150 and performs a function of preventing the sensing coil 110 from being damaged due to friction caused by a contact with the metal portion 150 and movement of the metal portion 150.

The protection member 140 may be formed of various materials without a particular limitation. However, it is preferable that the protection member 140 is formed of an insulating material in order to increase accuracy in sensing by limiting a factor that affects the inductance change in the sensing coil 110 to the movement or deformation of the metal portion 150.

The force sensing unit FSU does not necessarily include the protection member 140. In a case in which the force sensing unit FSU includes the protection member 140, the metal portion 150 may be in contact with the protection member 140. On the other hand, in a case in which the force sensing unit FSU does not include the protection member 140, the metal portion 150 may be in direct contact with the sensing coil 110.

In a case in which the force sensing unit FSU includes the protection member 140, a distance between the sensing coil 110 and the metal portion 150 that is in contact with the protection member 140 may be maintained, and the distance between the sensing coil 110 and the metal portion 150 corresponds to a thickness of the protection member 140. The thickness of the protection member 140 is not particularly limited as long as a position change of the metal portion 150 or the like may be transferred to the sensing coil 110 to induce the inductance change.

According to an embodiment, a distance between the housing 500 and the sensing coil 110 does not need to be long, which is advantageous. Therefore, the protection member 140 may have a minimum thickness at which the sensing coil 110 may be protected from the friction caused by the movement of the metal portion 150, thereby more surely implementing the above-described advantage.

The metal portion 150 is a portion that induces the inductance change in the sensing coil 110 as the overlapping region between the metal portion 150 and the sensing coil 110 is changed due to an applied touch.

For example, as illustrated in FIGS. 2A and 2B, the overlapping region between the metal portion 150 and the sensing coil 110 may be increased from OV1 to OV2 due to movement of the metal portion 150. In this case, the inductance generated in the sensing coil 110 may also be changed according to the degree of change (OV2−OV1) of the overlapping region.

For example, either one or both of a position and a size of the contact region between the metal portion 150 and the force sensing unit FSU may be changed when a touch is applied.

A factor that causes the change of the position or the size of the contact region between the metal portion 10 and the force sensing unit FSU may vary. For example, the factor may include deformation of the metal portion 150 due to pressure transferred from the housing 500, and a position change of the force sensing unit FSU due to pressure transferred from the housing 500.

In other words, the metal portion 150 may be deformed according to a pressure intensity of an applied touch, and accordingly, a position of a portion that is in contact with the force sensing unit FSU may be changed, or a size of the contact region may be changed. Alternatively, the force sensing unit FSU may move in a direction in which a touch is applied, according to a pressure intensity of the applied touch, and accordingly, a size of the contact region between the force sensing unit FSU and the metal portion 150 whose position is fixed may be changed.

Specific embodiments in which deformation of the metal portion 150 or movement of the force sensing unit FSU occurs when a touch is applied as described above are illustrated in FIGS. 4 through 11, and will be described in more detail with reference to the respective drawings.

Referring to FIG. 3, the touch sensing device 100 according to various embodiments may have a common implementation method S100.

First, when a touch is applied to the touch switch portion TSW of the electronic device 10 in operation S110, the metal portion 150 is deformed in operation S121, the position of the metal portion 150 is changed in operation S123, or the position of the force sensing unit FSU may be changed in operation S125. Here, the respective change aspects (operations S121, S123, and S125) are not necessarily mutually exclusive, and two or more of the three change aspects may be shown at the same time. That is, for example, when a touch is applied in operation S110, the metal portion 150 may be deformed in operation S121, and, at the same time, the position of the metal portion 150 may be changed in operation S123.

However, in a case in which the metal portion 150 and the force sensing unit FSU move in the same direction, and thus a change of a positional relationship between the metal portion 150 and the force sensing unit FSU is offset, there is no or little change in the overlapping region between the metal portion 150 and the sensing coil 110. Therefore, it is preferable to exclude such a change aspect.

Further, as illustrated in FIG. 3, in a case in which the metal portion 150 is deformed in operation S121, the position of the metal portion 150 is changed in operation S123, or the position of the force sensing unit FSU is changed in operation S125, the overlapping region between the sensing coil 110 and the metal portion 150 may be changed.

As an example, the position of the contact region between the metal portion 150 and the force sensing unit FSU may be changed when a touch is applied. That is, in an entire region of a winding surface of the sensing coil 110, a region with which the metal portion 150 overlaps may be changed.

For example, the metal portion 150 may be disposed so as to overlap with an edge region of the sensing coil 110 before a touch is applied, and may move so as to overlap with a central region of the sensing coil 110 when a touch is applied. As such, as the position of the overlapping region between the sensing coil 110 and the metal portion 150 is changed in operation S130, a change of the inductance generated in the sensing coil 110 may be induced in operation S140.

As another example, the size of the contact region between the metal portion 150 and the force sensing unit FSU may be changed when a touch is applied. That is, the size of the overlapping region between the sensing coil 110 and the metal portion 150 may be changed.

For example, as illustrated in FIG. 2A, the metal portion 150 may be disposed so that the size of the overlapping region between the metal portion 150 and the sensing coil 110 is relatively small before a touch is applied. Further, as illustrated in FIG. 2B, the metal portion 150 may move so that the size of the overlapping region between the metal portion 150 and the sensing coil 110 is relatively large when a touch is applied. As such, as the size of the overlapping region between the sensing coil 110 and the metal portion 150 is changed in operation S130, a change of the inductance generated in the sensing coil 110 may be induced in operation S140.

This may achieve the same effect as that in a case in which a distance between a metal housing of an electronic device and a sensing coil of a touch sensing device, according to the related art, that does not include the metal portion decreases. That is, movement or deformation of the metal portion 150 on one surface of the force sensing unit FSU may induce the inductance change in the sensing coil 110, because the movement or deformation of the metal portion 150 achieves the same function as that in a case in which the metal housing is bent and approaches the sensing coil in the touch sensing device according to the related art.

Next, referring to FIG. 3, as the inductance change in the sensing coil 110 is induced in operation S140, the resonant frequency of the resonance signal generated in the touch sensing device 100 may be changed in operation S150. Then, the touch sensing device 100 may identify a normal touch input based on a change amount of the resonant frequency, and generate a touch input signal for the normal touch input in operation S160.

The degree of change of the position or size of the overlapping region between the metal portion 150 and the sensing coil 110 may vary depending on a pressure intensity of the applied touch. That is, in a case in which the user applies a relatively high pressure to the touch switch portion TSW, the size of the overlapping region between the sensing coil 110 and the metal portion 150 may be greatly increased from that before the pressure is applied. In this case, the amount of change of the inductance measured in the sensing coil 110 and the amount of change of the resonant frequency of the generated resonance signal are large, with the change of the resonant frequency being induced from the inductance change.

For example, a threshold for identifying a normal touch input among multiple touches applied to the touch switch portion TSW may be set in the touch sensing device 100.

As described above, in a case in which the user applies a relatively high pressure to the touch switch portion TSW, the resonant frequency change amount is relatively large and may exceed the preset threshold. Then, the touch that is made by the user by applying a relatively high pressure may generate the touch input signal.

On the other hand, in a case in which the user applies a relatively low pressure to the touch switch portion TSW, the size of the overlapping region between the sensing coil 110 and the metal portion 150 may be slightly increased from that before the pressure is applied. In this case, the amount of change of the inductance measured in the sensing coil 110 and the amount of change of the resonant frequency of the generated resonance signal are not large and may be smaller than the preset threshold, with the change of the resonant frequency being induced from the inductance change. That is, the touch that is made by the user by applying a relatively low pressure may not generate the input signal, and thus may be identified as an error, rather than a normal touch input.

Hereinafter, structures of touch sensing devices according to respective embodiments illustrated in FIGS. 4 through 11 will be described.

Figure 4:
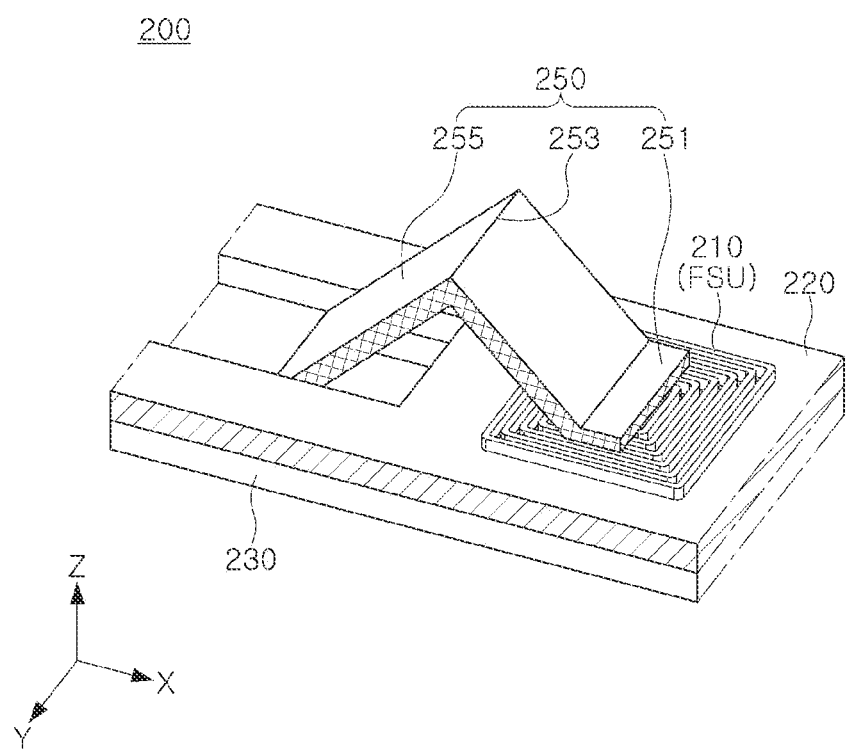
FIG. 4 is a perspective view illustrating a main structure of a touch sensing device, according to an embodiment.
Figure 5A:
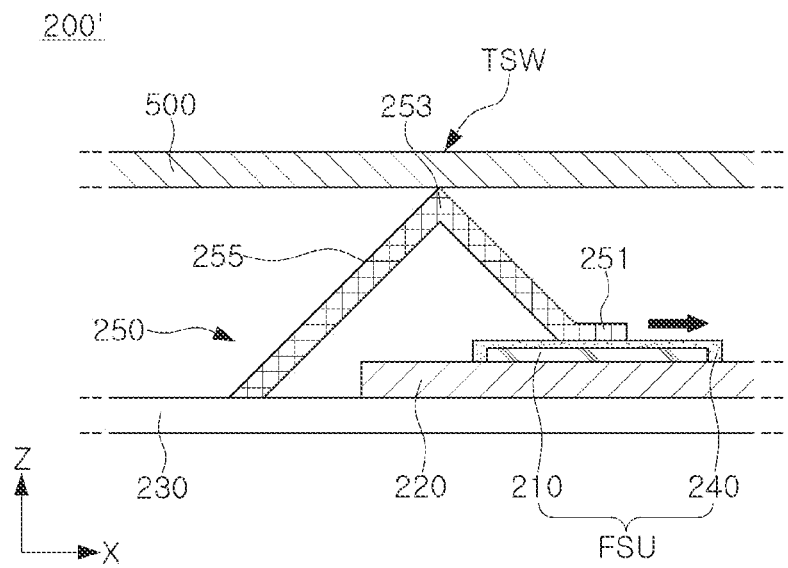
FIGS. 5A and 5B are front views in an X-Z plane, illustrating a touch sensing device that is a modified example of the touch sensing device.
Figure 5B:
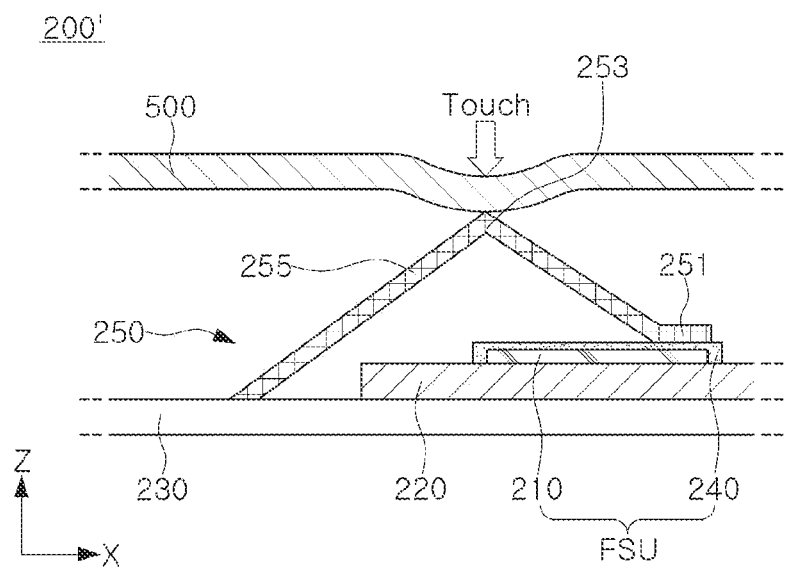

FIG. 4 is a perspective view illustrating a main structure of a touch sensing device 200, according to an embodiment. FIGS. 5A and 5B are front views in an X-Z plane, illustrating a touch sensing device 200' that is a modified example of the touch sensing device 200 of FIG. 4.

Referring to FIGS. 4 through 5B, the touch sensing devices 200 and 200' may each include a sensing coil 210, a board 220, a bracket 230, and a metal portion 250. The touch sensing device 200 does not include a protection member covering the sensing coil 210. Therefore, a force sensing unit FSU included in the touch sensing device 200 may correspond to the sensing coil 210 itself.

On the other hand, the touch sensing device 200' illustrated in FIGS. 5A and 5B includes a protection member 240. Therefore, a force sensing unit FSU included in the touch sensing device 200' may include the sensing coil 210 and the protection member 240.

The touch sensing devices 200 and 200' each include the force sensing unit FSU, and the force sensing unit FSU may be disposed on the board 220 and supported by the bracket 230.

The force sensing unit FSU has one surface in contact with a part of the metal portion 250. That is, in the touch sensing device 200 illustrated in FIG. 4, the metal portion 250 is in direct contact with a winding surface of the sensing coil 210 of the force sensing unit FSU. In the touch sensing device 200' illustrated in FIGS. 5A and B, the metal portion 250 is in contact with the protection member 240 of the force sensing unit FSU.

The sensing coil 210 may be a winding type coil, and a shape of the winding type coil is not particularly limited. In addition, the sensing coil 210 may also be implemented by forming a wiring pattern on a printed circuit board (PCB) or a flexible printed circuit board (FPCB), or including a chip inductor.

The sensing coil 210 has an inductance that varies when a force touch is applied. For example, a position of a contact region between the metal portion 250 and the force sensing unit FSU may be changed when external pressure is applied, and as a result, a position of an overlapping region between the sensing coil 210 and the metal portion 250 may be changed.

The board 220 may have a space in which the sensing coil 210 is disposed, and may be supported by the bracket 230. The board 220 may be a FPCB, but is not limited thereto. That is, in addition to the FPCB, various types of boards having a structure in which at least one metal layer and at least one wiring layer are alternately stacked may be used as the board 220.

The bracket 230 may support the board 220 and the metal portion 250. One end of the metal portion 250 may be fixed to the bracket 230. Therefore, when external pressure is applied and then removed, the metal portion 250 may be restored to an original position based on the fixed one end.

Further, the bracket 230 may be disposed to be spaced apart from the housing 500 to maintain a structure of the metal portion 250 disposed between the bracket 230 and the housing 500. The bracket 230 may be directly inserted into an electronic device to which the touch sensing device 200 or 200' is applied, and may be supported using a separate support member.

The bracket 230 may be formed of a conductive material such as a metal, but is not limited to being formed of a metal. A material of the bracket 230 is not particularly limited, as long as the bracket 230 may stably support the structures of the touch sensing devices 200 and 200'.

The protection member 240 may be disposed to cover the sensing coil 210 and may have one surface in contact with the metal portion 250. That is, the protection member 240 is disposed between the sensing coil 210 and the metal portion 250 and performs a function of preventing the sensing coil 210 from being damaged due to friction caused by a contact with the metal portion 250 and movement of the metal portion 250.

The protection member 240 may be formed of various materials, without a particular limitation. However, it is preferable that the protection member 240 is formed of an insulating material in order to increase accuracy in sensing by limiting a factor that affects the inductance change in the sensing coil 210 to the movement and deformation of the metal portion 250.

The metal portion 250 may have a bent shape, as illustrated in FIGS. 4 through 5B. For example, one end of the metal portion 250 may be coupled to the bracket 230, and the other end of the metal portion 250 may be in contact with the force sensing unit FSU. The other end of the metal portion 250 may move in the horizontal direction on one surface of the force sensing unit FSU when external pressure is applied.

Referring to FIGS. 4 through 5B, one region of the metal portion 250 is in contact with the housing 500, and the other region of the metal portion 250 is in contact with the force sensing unit FSU. Therefore, when external pressure is transferred from the housing 500 to the one region, the other region may move in the horizontal direction on one surface of the force sensing unit FSU.

More specifically, the metal portion 250 includes, for example, a contact portion 251, a pressing portion 253, and an inclined portion 255.

The inclined portion 255 may be connected to the bracket 230 and may have a predetermined inclination with respect to the board 220. Opposite ends of the inclined portion 255 are connected to one end of the pressing portion 253 and the bracket 230, respectively, and the inclination of the inclined portion 255 may be changed when the pressing portion 253 is deformed.

The pressing portion 253 may be connected to the inclined portion 255 and may protrude in a direction away from the sensing coil 210. The pressing portion 253 may protrude to be in contact with the housing 500, and may be deformed by pressure transferred from the housing 500.

The contact portion 251 may be connected to the pressing portion 253, and may be in contact with one surface of the force sensing unit FSU. One end of the contact portion 251 is connected to one end of the pressing portion 253, and the other end of the contact portion 251 is in contact with the force sensing unit FSU and may move in the horizontal direction on one surface of the force sensing unit FSU when the pressing portion 253 is deformed.

A change resulting from external pressure applied to the touch sensing device 200 or 200' is illustrated in FIGS. 5A and 5B. A more detailed description of the change resulting from the external pressure applied to the touch sensing device 200 or 200' will be provided with reference to FIGS. 5A and 5B.

As illustrated in FIGS. 5A and 5B, when the touch sensing device 200' is mounted in the housing 500, an uppermost end of the pressing portion 253 may be in contact with the housing 500.

When the user applies external pressure to the touch switch portion TSW of the electronic device 10, the housing 500 is bent as illustrated in FIG. 5B, and the pressure is transferred to the pressing portion 253. Then, the pressing portion 253 may descend from a position where the pressing portion 253 is positioned before the external pressure is applied, and the metal portion 250 having an entirely bent shape may be deformed so that an angle at which the metal portion 250 is bent is increased. Here, an inclination of the inclined portion 255 with respect to the board 200 may be decreased.

As the metal portion 250 is deformed as described above, the contact portion 251, which is one end of the metal portion 250 that is in contact with the force sensing unit FSU, may move in the horizontal direction on one surface of the force sensing unit FSU.

For example, when external pressure is applied, the contact portion 251 may move to the right as illustrated in FIG. 5B, and a position of an overlapping region between the contact portion 251 and the sensing coil 210 may be changed. That is, the contact portion 251 may move to be slid to the right in a state in which one surface of the contact portion 251 is in contact with the protection member 240, thereby changing a contact region between the contact portion 251 and the protection member 240.

As the position of the overlapping region between the metal portion 250 and the sensing coil 210 is changed from a central portion of the sensing coil 210 to an edge portion of the sensing coil 210, the inductance of the sensing coil 210 may be changed.

Meanwhile, one surface of the contact portion 251 may move in the horizontal direction while maintaining a small gap without being in complete contact with the force sensing unit FSU. In this case, the sensing coil 210 or the protection member 240 covering an upper portion of the sensing coil 210 may be prevented from being damaged due to repetitive movement of the metal portion 250.

In addition, since the metal portion 250 entirely descends when pressure is transferred to the pressing portion 253, the inductance change due to a decrease in distance between the metal portion 250 and the sensing coil 210 may occur at the same time.

Therefore, the inductance change in the sensing coil 210 may be induced as much as a change amount corresponding to the sum of the change of the position of the overlapping region between the sensing coil 210 and the metal portion 250, and the change of the distance between the metal portion 250 and the sensing coil 210. Therefore, the sensitivities of the touch sensing devices 200 and 200' may be improved.

Figure 6:
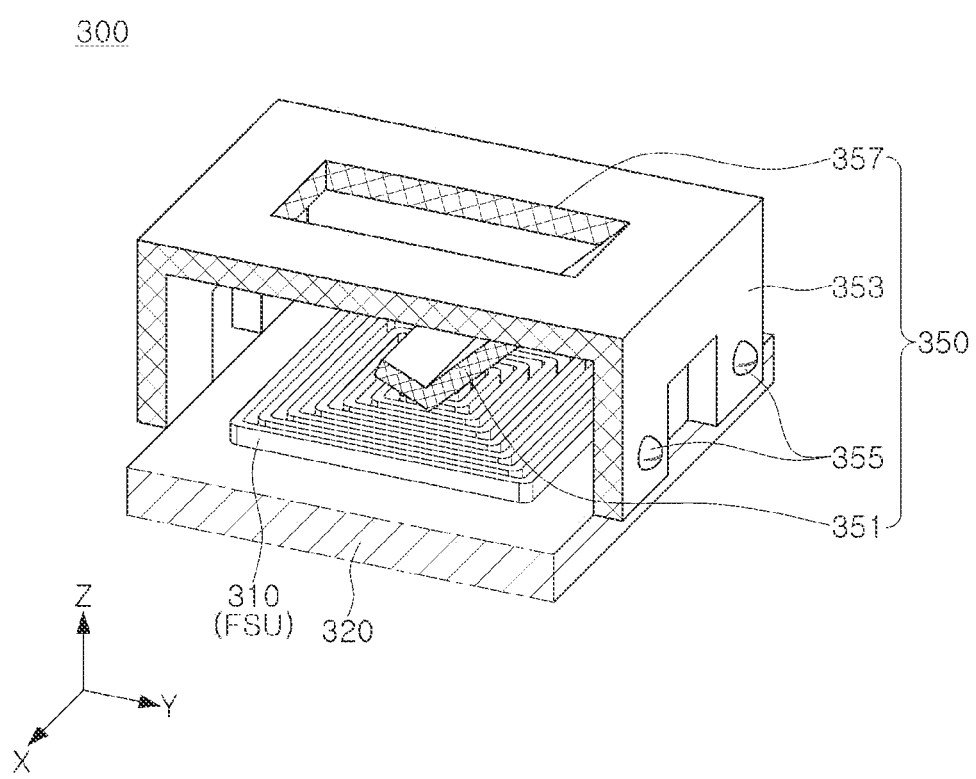
FIG. 6 is a perspective view illustrating a main structure of a touch sensing device, according to another embodiment.
Figure 7A:
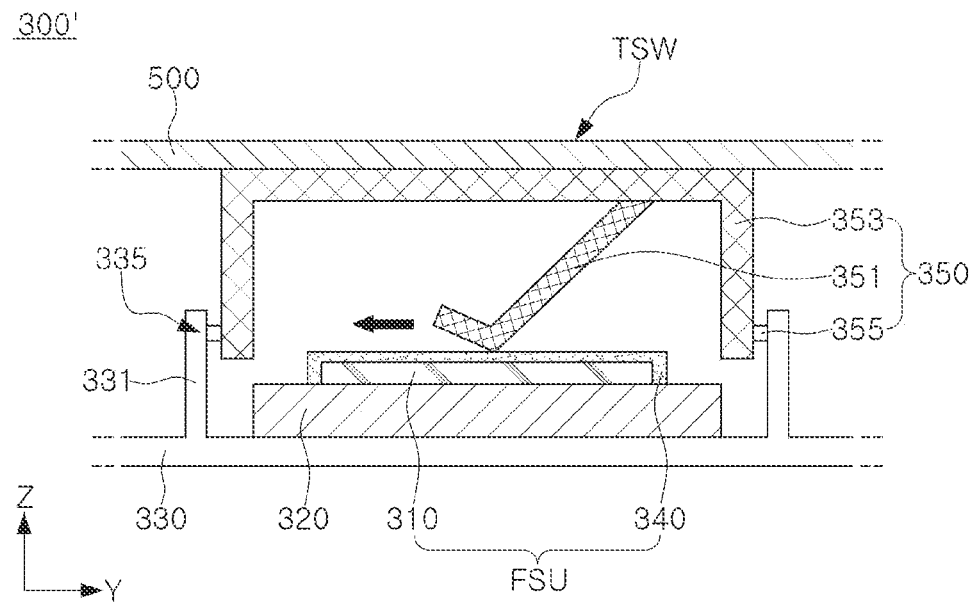
FIGS. 7A and 7B are front views in a Y-Z plane, illustrating a touch sensing device that is a modified example of the touch sensing device of FIG. 6.
Figure 7B:
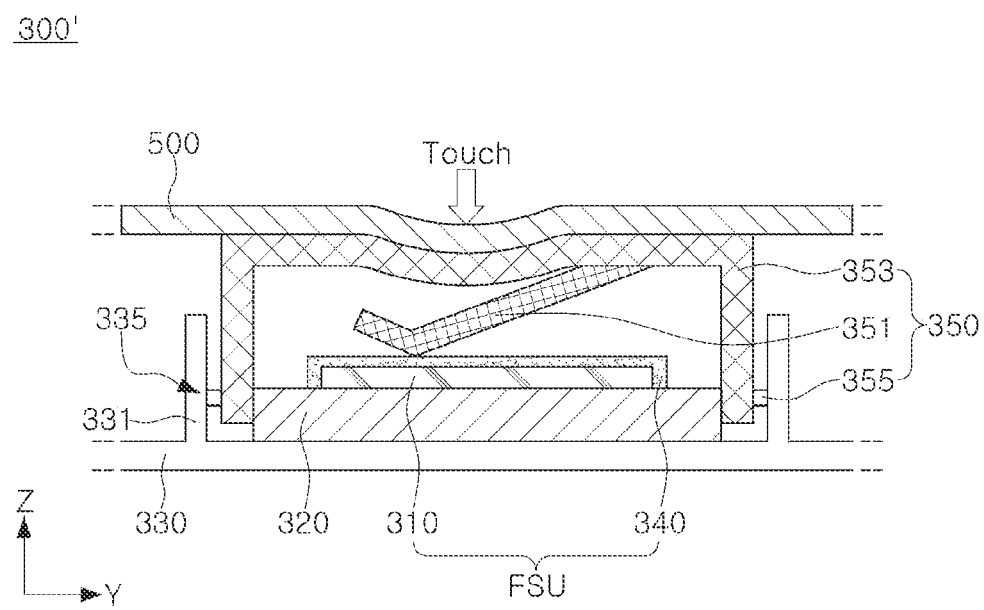

FIG. 6 is a perspective view illustrating a main structure of a touch sensing device 300, according to another embodiment. FIGS. 7A and 7B are front views in a Y-Z plane, illustrating a touch sensing device 300' that is a modified example of the touch sensing device 300 of FIG. 6.

Referring to FIGS. 6 through 7B, the touch sensing devices 300 and 300' may each include, for example, a sensing coil 310, a board 320, a bracket 330, and a metal portion 350. The touch sensing device 300 illustrated in FIG. 6 does not include a protection member covering the sensing coil 310. Therefore, a force sensing unit FSU included in the touch sensing device 300 may correspond to the sensing coil 310 itself.

On the other hand, the touch sensing device 300' illustrated in FIGS. 7A and 7B includes a protection member 340. Therefore, a force sensing unit FSU included in the touch sensing device 300' may include the sensing coil 310 and the protection member 340.

The touch sensing devices 300 and 300' may each include the force sensing unit FSU, and the force sensing unit FSU may be disposed on the board 320 and supported by the bracket 330.

The force sensing unit FSU has one surface in contact with a part of the metal portion 350. That is, in the touch sensing device 300 illustrated in FIG. 6, the metal portion 350 is in direct contact with a winding surface of the sensing coil 310 of the force sensing unit FSU. In the touch sensing device 300' illustrated in FIGS. 7A and 7B, the metal portion 350 is in contact with the protection member 340 of the force sensing unit FSU.

The sensing coil 310 may be a winding type coil, and a shape of the winding type coil is not particularly limited. In addition, the sensing coil 310 may also be implemented by forming a wiring pattern on a printed circuit board (PCB) or a flexible printed circuit board (FPCB), or including a chip inductor.

The sensing coil 310 has an inductance that varies when a force touch is applied. For example, a position of a contact region between the metal portion 350 and the force sensing unit FSU may be changed when external pressure is applied, and, as a result, a position of an overlapping region between the sensing coil 310 and the metal portion 350 may be changed.

The board 320 may have a space in which the sensing coil 310 is disposed, and may be supported by the bracket 330. The board 320 may be a FPCB, but is not limited thereto. That is, in addition to the FPCB, various types of boards having a structure in which at least one metal layer and at least one wiring layer are alternately stacked may be used as the board 320.

The bracket 330 may support the board 320 and the metal portion 350. Opposite side surfaces of the metal portion 350 may be coupled to the bracket 330 to be movable within a movable range. Therefore, when external pressure is applied and then removed, the metal portion 350 may be restored to an original position or original shape after moving within a set range.

Further, the bracket 330 may be disposed to be spaced apart from the housing 500 to maintain a structure of the metal portion 350 disposed between the bracket 330 and the housing 500. The bracket 330 may be directly inserted into an electronic device to which the touch sensing device 300 or 300' is applied, and may be supported using a separate support member.

The bracket 330 may be formed of a conductive material such as a metal, but is not limited to being formed of a metal. A material of the bracket 330 is not particularly limited, as long as the bracket 330 may stably support the structures of the touch sensing devices 300 and 300'.

The bracket 330 may include a pair of extended portions 331 and coupling portions 335. The pair of extended portions 331 may extend in a direction perpendicular to the housing 500 so as to face each other, and the coupling portions 335 may be disposed symmetrically on the respective extended portions 331.

A cover portion 353 of the metal portion 350 is disposed in a space between the pair of extended portions 331, and when external pressure is applied, the cover portion 353 may move in a vertical direction within the space. Here, a protruding portion 355 of the metal portion 350 may be coupled to the coupling portion 335. The protruding portion 355 is not fixedly coupled, but may be coupled so that the metal portion 350 may move within a predetermined range.

The protection member 340 may be disposed to cover the sensing coil 310 and have one surface in contact with the metal portion 350. That is, the protection member 340 is disposed between the sensing coil 310 and the metal portion 350 and performs a function of preventing the sensing coil 310 from being damaged due to friction caused by a contact with the metal portion 350 and movement of the metal portion 350.

The protection member 340 may be formed of various materials, without a particular limitation. However, it is preferable that the protection member 340 is formed of an insulating material in order to increase accuracy in sensing by limiting a factor that affects the inductance change in the sensing coil 310 to the movement and deformation of the metal portion 350.

The metal portion 350 may have a "C" shape, as illustrated in FIGS. 6 through 7B. One end of the metal portion 350 is coupled to the bracket 330, and the other end of the metal portion 350 is in contact with the force sensing unit FSU. The other end of the metal portion 350 may move in the horizontal direction on one surface of the force sensing unit FSU when external pressure is applied.

Referring to FIGS. 6 through 7B, one region of the metal portion 350 is in contact with the housing 500, and the other region of the metal portion 350 is in contact with the force sensing unit FSU. Therefore, as external pressure is transferred from the housing 500 to the one region, the other region may move in the horizontal direction on one surface of the force sensing unit FSU.

For example, the metal portion 350 includes an elastic portion 351, the cover portion 353, and the protruding portion 355. Further, in a case in which the touch sensing devices 300 and 300' each include a pad, an opening portion 357 may be further provided in an upper surface portion of the cover portion 353 as illustrated in FIG. 6.

The cover portion 353 may have a "C" shape so as to surround an upper region of the sensing coil 310, and may have the upper surface portion that is in contact with the housing 500, and side surface portions formed at opposite ends of the upper surface portion in the vertical direction. The cover portion 353 may be disposed to be spaced apart from the sensing coil 310, and may move toward the sensing coil 310 when external pressure is applied. That is, the cover portion 353 may descend due to pressure transferred from the housing 500.

A plurality of protruding portions 355 may be formed on opposite sides of the cover portion 353, that is, on the side surface portions of the cover portion 353, respectively, and may be coupled to the bracket 330. The protruding portion 355 may be coupled to the coupling portion 335 of the bracket 330. The protruding portion 355 is not fixedly coupled, but may be coupled so that the protruding portion 355 may move in the vertical direction within a range in which the coupling portion 335 is formed.

For example, the coupling portion 335 may be formed in a groove shape having a predetermined length, and the protruding portion 355 may move within a movable range in which the groove is formed.

One end of the elastic portion 351 may be connected to the cover portion 353, and the other end of the elastic portion 351 may be in contact with the force sensing unit FSU. A position of a region of the elastic portion 351 that is in contact with the force sensing unit FSU may be changed when the cover portion 353 moves. That is, one end of the elastic portion 351 is connected to the upper surface portion of the cover portion 353, and the other end of the elastic portion 351 is in contact with the force sensing unit FSU, such that the elastic portion 351 may descend together with the cover portion 353.

Further, in a process of descending, the elastic portion 351 may be deformed so as to pivot at a predetermined angle around the one end connected to the cover portion 353. Accordingly, the other end of the elastic portion 351 that is in contact with the force sensing unit FSU may move in the horizontal direction on the force sensing unit FSU, and the position of the contact region may be changed.

A change resulting from external pressure applied to the touch sensing device 300 or 300' is illustrated in FIGS. 7A and 7B. A more detailed description of this change will be provided with reference to FIGS. 7A and 7B.

As illustrated in FIGS. 7A and 7B, when the touch sensing device 300' is mounted in the housing 500, the upper surface portion of the cover portion 353 may be in contact with the housing 500.

When the user applies external pressure to the touch switch portion TSW of the electronic device 10, the housing 500 is bent as illustrated in FIG. 7B, and the pressure is transferred to the cover portion 353. Then, the cover portion 353 descends toward the sensing coil 310, and the elastic portion 351 that is integrated with the cover portion 353 descends together with the cover portion 353.

One end of the elastic portion 351 that is connected to the cover portion 353 may pivot at a predetermined angle as if the elastic portion 351 is compressed in the vertical direction between the upper surface portion of the cover portion 353 and the force sensing unit FSU. As the metal portion 350 is deformed as described above, the other end of the elastic portion 351 that is in contact with the force sensing unit FSU may move in the horizontal direction on one surface of the force sensing unit FSU.

For example, when external pressure is applied, a part of the elastic portion 351 that is in contact with the force sensing unit FSU may move to the left as illustrated in FIG. 7B, and a position of an overlapping region between the elastic portion 351 and the sensing coil 310 may be changed. That is, one end of the elastic portion 351 may move to be slid to the left in a state in which the elastic portion 351 is in contact with the protection member 340, thereby changing a contact region between the elastic portion 351 and the protection member 340.

As the position of the overlapping region between the metal portion 350 and the sensing coil 310 is changed from a central portion of the sensing coil 310 to an edge portion of the sensing coil 310, the inductance of the sensing coil 310 may be changed.

One end of the elastic portion 351 may move in the horizontal direction while maintaining a small gap without being in complete contact with the force sensing unit FSU. In this case, the sensing coil 310 or the protection member 340 covering an upper portion of the sensing coil 310 may be prevented from being damaged due to repetitive movement of the metal portion 350.

In addition, since the metal portion 350 descends as a whole when pressure is transferred to the cover portion 353, the inductance change due to a decrease in distance between the entire structure of the metal portion 350 including the cover portion 353 and the sensing coil 310 may occur at the same time.

Therefore, according to the embodiments of FIGS. 6 to 7B, the inductance change in the sensing coil 310 may be induced as much as a change amount corresponding to the sum of the change of the position of the overlapping region between the sensing coil 310 and the metal portion 350, and the change of the distance between the metal portion 350 and the sensing coil 310. Therefore, the sensitivities of the touch sensing devices 300 and 300' may be improved.

Further, since the metal portion 350 has a structure including the cover portion 353 and the protruding portion 355, the metal portion 350 may be stably coupled to the bracket 330 and the internal structure of the electronic device 10, and structures and functions of various components provided in the electronic device 10 may be separated.

For example, in a case in which a plurality of sensing coils 310 corresponding to different touch switch portions (TSW), respectively, are provided in the electronic device 10, as the cover portion 353 is formed so as to cover each sensing coil 310, such that signals of different sensing coils 310 may be separated from each other. Therefore, malfunction occurring among a plurality of touch sensing devices 300 or 300' that function as individual buttons, respectively, may be reduced.

Figure 8:
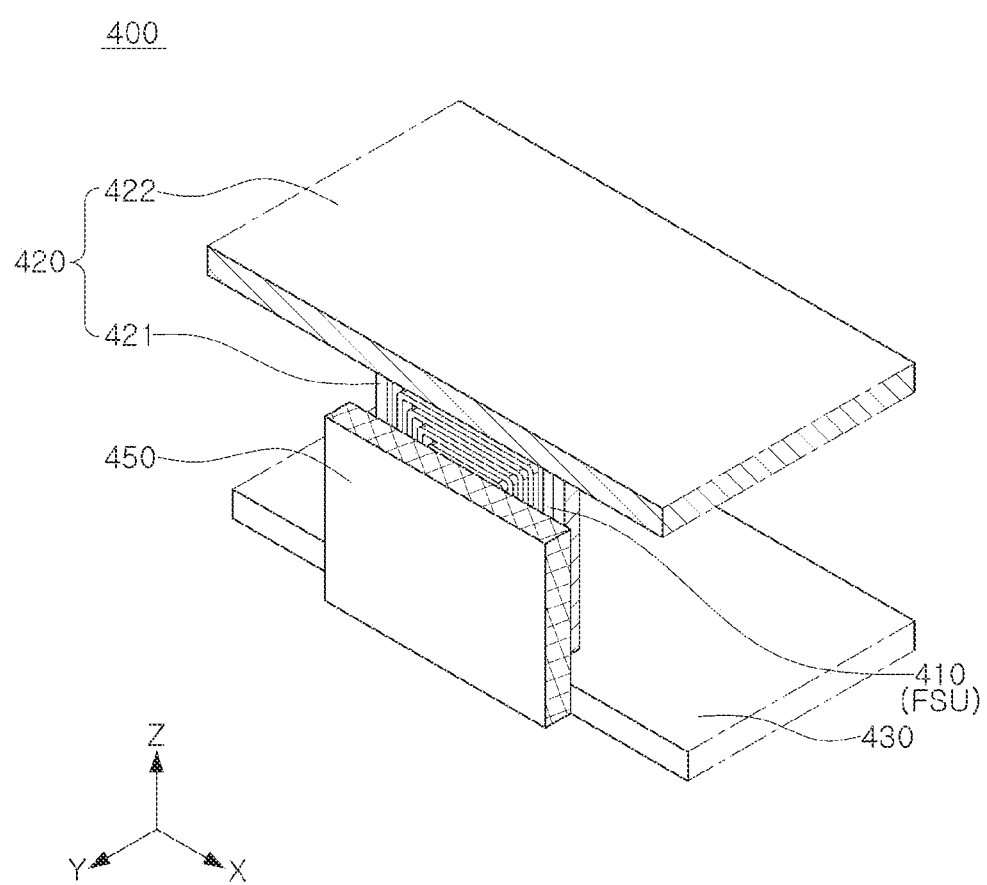
FIG. 8 is a perspective view illustrating a main structure of a touch sensing device, according to another embodiment.
Figure 9A:
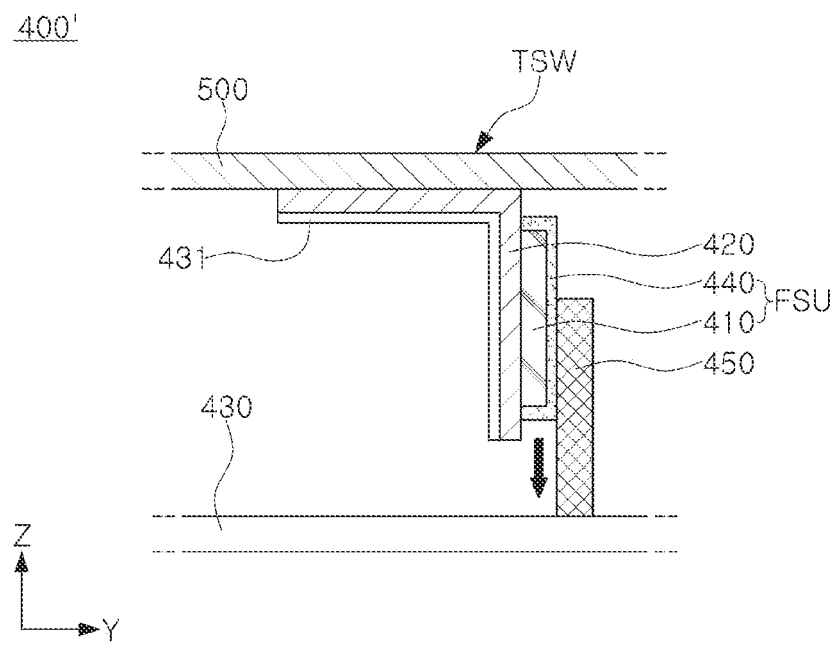
FIGS. 9A and 9B are front views in the Y-Z plane, illustrating a touch sensing device that is a modified example of the touch sensing device of FIG. 8.
Figure 9B:
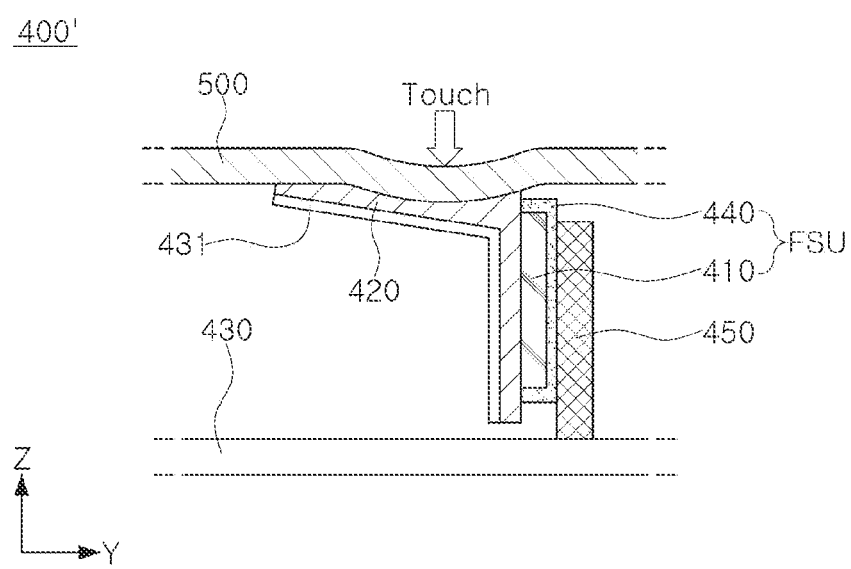

FIG. 8 is a perspective view illustrating a main structure of a touch sensing device 400, according to another embodiment. FIGS. 9A and 9B are front views in a Y-Z plane, illustrating a touch sensing device 400' that is a modified example of the touch sensing device 400 of FIG. 8.

Referring to FIGS. 8 through 9B, the touch sensing devices 400 and 400' may each include, for example, a sensing coil 410, a board 420, a bracket 430, and a metal portion 450. The touch sensing device 400 illustrated in FIG. 8 does not include a protection member covering the sensing coil 410. Therefore, a force sensing unit FSU included in the touch sensing device 400 may correspond to the sensing coil 410 itself.

On the other hand, the touch sensing device 400' illustrated in FIGS. 9A and 9B includes a protection member 440. Therefore, a force sensing unit FSU included in the touch sensing device 400' may include the sensing coil 410 and the protection member 440.

The touch sensing devices 400 and 400' each include the force sensing unit FSU, and the force sensing unit FSU may be disposed on the board 420 and supported by the bracket 430.

The force sensing unit FSU has one surface in contact with a part of the metal portion 450. That is, in the touch sensing device 400 illustrated in FIG. 8, the metal portion 450 is in direct contact with a winding surface of the sensing coil 410 of the force sensing unit FSU. In the touch sensing device 400' illustrated in FIGS. 9A and 9B, the metal portion 450 is in contact with the protection member 440 of the force sensing unit FSU.

The sensing coil 410 may be a winding type coil, and a shape of the winding type coil is not particularly limited. In addition, the sensing coil 410 may also be implemented by forming a wiring pattern on a printed circuit board (PCB) or a flexible printed circuit board (FPCB), or including a chip inductor.

The sensing coil 410 has an inductance that varies when a force touch is applied. For example, a position of a contact region between the metal portion 450 and the force sensing unit FSU may be changed when external pressure is applied, and, as a result, a position of an overlapping region between the sensing coil 410 and the metal portion 450 may be changed.

The board 420 may have a space in which the sensing coil 410 is disposed, and may be supported by the bracket 430. The board 420 may be a FPCB, but is not limited thereto. That is, in addition to the FPCB, various types of boards having a structure in which at least one metal layer and at least one wiring layer are alternately stacked may be used as the board 420.

The board 420 has a first surface 421 on which the force sensing unit FSU is disposed and a second surface 422 perpendicular to the first surface 421. The metal portion 451 is disposed parallel to the first surface 421, and a size of a region of the metal portion 450 that overlaps with the sensing coil 410 may be changed when the force sensing unit FSU moves.

Referring to FIGS. 8 through 9B, the first surface 421 of the board 420 is extends perpendicular to the housing 500, and the second surface 422 may be in contact with the housing 500 while extending parallel to the housing 500. When external pressure is applied to the touch switch portion TSW of the electronic device 10, the pressure may be transferred to the second surface 422 of the board 420 that is in contact with the housing 500. As the board 420 descends due to the pressure transferred from the housing 500, a size of an overlapping region between the force sensing unit FSU and the metal portion 450 may be changed.

The bracket 430 may support the board 420 and the metal portion 450. The bracket 430 may include an upper bracket 431 supporting the first and second surfaces 421 and 422 of the board 420. The upper bracket 431 may descend together with the board 420 when external pressure is applied.

Further, the bracket 430 may be spaced apart from the housing 500 and maintain a structure of the metal portion 450 disposed between the bracket 430 and the housing 500. For example, one end of the metal portion 450 may be fixedly coupled to the bracket 430. Here, the bracket 430 may be directly inserted into an electronic device 10 to which the touch sensing device 400 or 400' is applied, and may be supported using a separate support member.

The bracket 430 may be formed of a conductor such as a metal, but is not limited to being formed of a metal. A material of the bracket 430 is not particularly limited, as long as the bracket 430 may stably support the structures of the touch sensing devices 400 and 400'.

The protection member 440 may be disposed on the first surface 421 of the board 420 to cover the sensing coil 410, and the metal portion 450 may be in contact with the protection member 440. That is, the protection member 440 is disposed between the sensing coil 410 and the metal portion 450, and performs a function of preventing the sensing coil 410 from being damaged due to friction with the metal portion 450 that is caused by movement of the board 420.

The protection member 440 may be formed of various materials, without a particular limitation. However, it is preferable that the protection member 440 is formed of an insulating material in order to increase accuracy in sensing by limiting a factor that affects the inductance change in the sensing coil 410 to a change of a size of a contact region between the force sensing unit FSU and the metal portion 450.

The metal portion 450 may be fixed on the bracket 430 to be perpendicular to the bracket 430 as illustrated in FIGS. 8 through 9B, and may be disposed to extend perpendicular to the housing 500. The metal portion 450 and the housing 500 may be spaced apart from each other as illustrated in the drawings, or may be in contact with each other.

Referring to FIGS. 8 through 9B, one surface of the metal portion 450 may be in contact with one surface of the force sensing unit FSU. When the board 420 descends due to an applied external pressure, the force sensing unit FSU may descend together with the board 420, and the size of the contact region between the metal portion 450 and the force sensing unit FSU may be changed.

A change resulting from external pressure applied to the touch sensing device 400 or 400' is illustrated in FIGS. 9A and 9B. A more detailed description of this change will be provided with reference to FIGS. 9A and 9B.

As illustrated in FIGS. 9A and 9B, when the touch sensing device 400' is mounted in the housing 500, the second surface 422 of the board 420 may be in contact with the housing 500.

When the user applies external pressure to the touch switch portion TSW of the electronic device 10, the housing 500 is bent as illustrated in FIG. 9B, and the pressure is transferred to the second surface 422 of the board 420. Then, the entire board 420 descends toward the sensing coil 410, and the force sensing unit FSU, which is disposed on the first surface 421, may descend together with the board 420.

As a result, a size of an overlapping region between the metal portion 450 and the sensing coil 410 may be increased, the inductance of the sensing coil 410 may also be changed.

Meanwhile, one surface of the metal portion 450 does not have to be in complete contact with the force sensing unit FSU, and a small gap between one surface of the metal portion 450 and the force sensing unit FSU may be maintained. In this case, the sensing coil 410 or the protection member 440 covering an upper portion of the sensing coil 410 may be prevented from being damaged due to repetitive movement of the board 420.

Figure 10:
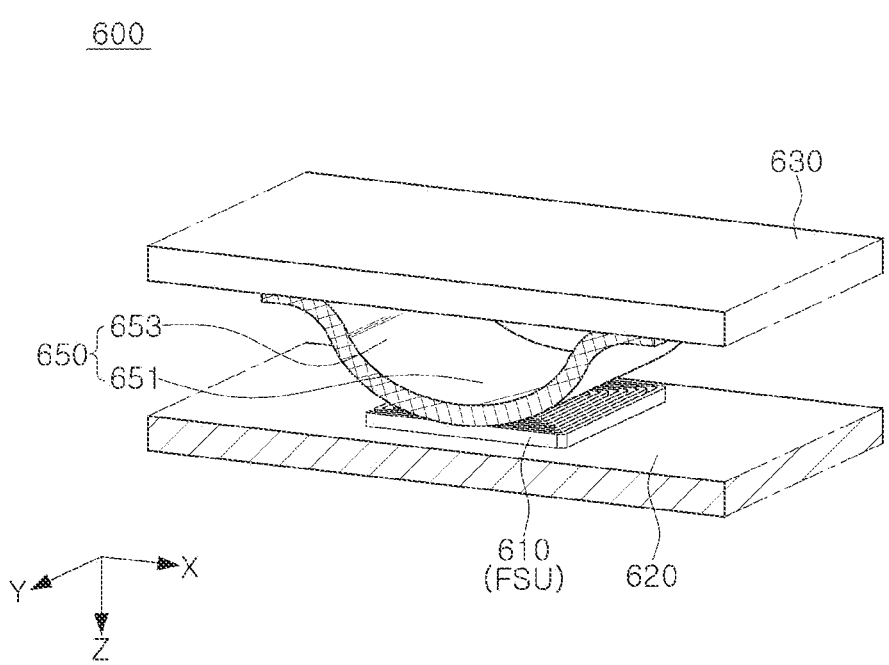
FIG. 10 is a perspective view illustrating a main structure of a touch sensing device, according to another embodiment.
Figure 11A:
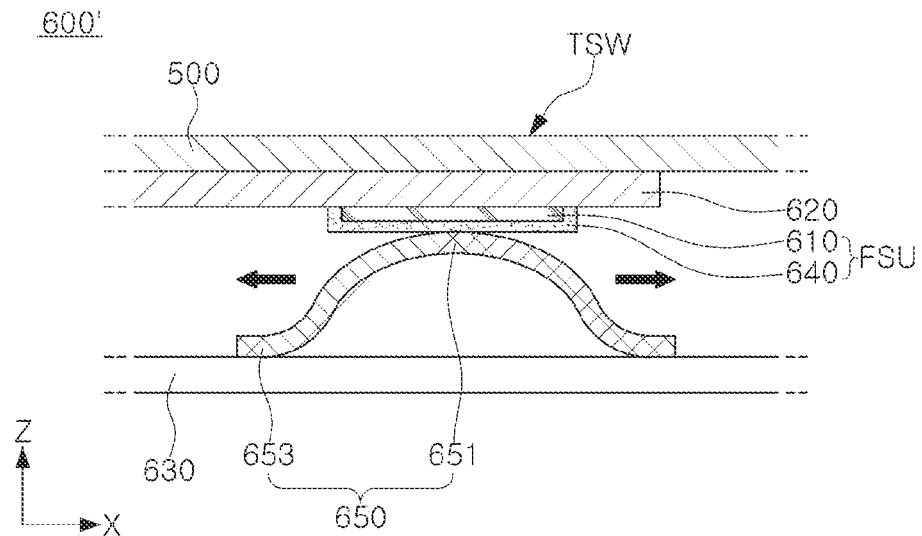
FIGS. 11A and 11B are front views in the X-Z plane, illustrating a touch sensing device that is a modified example of the touch sensing device of FIG. 10.
Figure 11B:
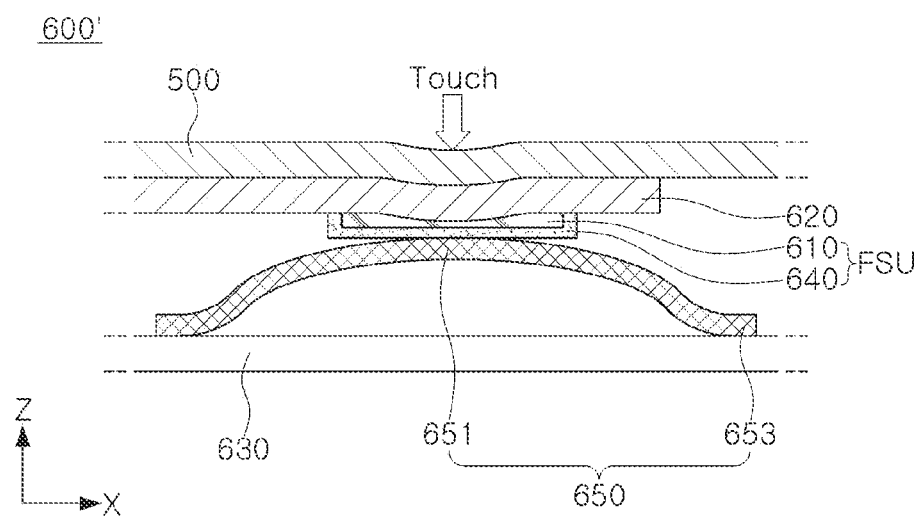

FIG. 10 is a perspective view illustrating a main structure of a touch sensing device 600, according to another embodiment. FIGS. 11A and 11B are front views in an X-Z plane, illustrating a touch sensing device 600' that is a modified example of the touch sensing device 600 of FIG. 10.

Referring to FIGS. 10 through 11B, touch sensing devices 600 and 600' may each include a sensing coil 610, a board 620, a bracket 630, and a metal portion 650. The touch sensing device 600 illustrated in FIG. 10 does not include a protection member covering the sensing coil 610. Therefore, a force sensing unit FSU included in the touch sensing device 600 may be the sensing coil 610 itself.

On the other hand, the touch sensing device 600' illustrated in FIGS. 11A and 11B includes a protection member 640. Therefore, a force sensing unit FSU included in the touch sensing device 600' may include the sensing coil 610 and the protection member 640.

The touch sensing devices 600 and 600' each include the force sensing unit FSU, and the force sensing unit FSU may be disposed on the board 620.

The force sensing unit FSU has one surface in contact with a part of the metal portion 650. That is, in the touch sensing device 600 illustrated in FIG. 10, the metal portion 650 is in direct contact with a winding surface of the sensing coil 610 of the force sensing unit FSU. In the touch sensing device 600' illustrated in FIGS. 11A and 11B, the metal portion 650 is in contact with the protection member 640 of the force sensing unit FSU.

That is, the metal portion 650 may be disposed between the housing 500 and the bracket 630, and the force sensing unit FSU may be disposed between the housing 500 and the metal portion 650. When pressure is transferred from the housing 500 to the force sensing unit FSU, a size of a contact region between the force sensing unit FSU and the metal portion 650 is changed.

The sensing coil 610 may be a winding type coil, and a shape of the winding type coil is not particularly limited. In addition, the sensing coil 610 may also be implemented by forming a wiring pattern on a printed circuit board (PCB) or a flexible printed circuit board (FPCB), or including a chip inductor.

The sensing coil 610 has an inductance that varies when a force touch is applied. For example, the size of the contact region between the metal portion 650 and the force sensing unit FSU may be changed when external pressure is applied, and as a result, a size of an overlapping region between the sensing coil 610 and the metal portion 650 may be changed.

The board 620 may have a space in which the sensing coil 610 is disposed, and may be disposed to be in contact with the housing 500 as illustrated in FIGS. 10 through 11B. The board 620 may be a FPCB, but is not limited thereto. That is, in addition to the FPCB, various types of boards having a structure in which at least one metal layer and at least one wiring layer are alternately stacked may be used as the board 620.

The bracket 630 may support the board 620 and the metal portion 650. One part of the metal portion 650 may be in contact with the bracket 630, and the other part of the metal portion 650 may be in contact with the force sensing unit FSU. When external pressure is applied and then removed, the metal portion 650 may be deformed to be flattened and then restored to an original shape on the bracket 630.

Further, the bracket 630 may be disposed to be spaced apart from the housing 500 to maintain a structure of the metal portion 650 disposed between the bracket 630 and the housing 500. The bracket 630 may be directly inserted into an electronic device to which the touch sensing device 600 or 600' is applied, and may be supported using a separate support member.

The bracket 630 may be formed of a conductor such as a metal, but is not limited to being formed of a metal. A material of the bracket 630 is not particularly limited, as long as the bracket 630 may stably support the structures of the touch sensing devices 600 and 600'.

The protection member 640 may be disposed to cover the sensing coil 610 and may have one surface in contact with the metal portion 650. That is, the protection member 640 is disposed between the sensing coil 610 and the metal portion 650 and may perform a function of preventing the sensing coil 610 from being damaged due to friction caused by a contact with the metal portion 650 and deformation of the metal portion 650.

The protection member 640 may be formed of various materials, without a particular limitation. However, it is preferable that the protection member 640 is formed of an insulating material in order to increase accuracy in sensing by limiting a factor that affects the inductance change in the sensing coil 610 to a change of a size of the overlapping region between the sensing coil 610 and the metal portion 650.

The metal portion 650 may have a convex shape protruding downward. For example, the metal portion 60 may have a dome shape as illustrated in FIGS. 10 through 11B.

For example, the metal portion 650 includes a head portion 651, which is a central protruding region, and a plurality of support portions 653.

The plurality of support portions 653 may be in contact with the bracket 630 and may move on the bracket 630 when external pressure is applied. That is, when the board 620 and the force sensing unit FSU descend due to an applied external pressure, opposing support portions 653 may move away from each other on the bracket 630.

The head portion 651 may be disposed between the plurality of support portions 653 and may be in contact with the force sensing unit FSU. A size of a region of the head portion 651 that is contact with the force sensing unit FSU may be changed when the support portions 653 move.

A change resulting from external pressure applied to the touch sensing device 600 or 600' is illustrated in FIGS. 11A and 11B. A more detailed description of this change will be provided with reference to FIGS. 11A and 11B.

As illustrated in FIGS. 11A and 11B, when the touch sensing device 600' is mounted in the housing 500, the board 620 may be in contact with the housing 500, and the force sensing unit FSU may be disposed on the board 620. The bracket 630 may be disposed to be spaced apart from the housing 500, and may face the force sensing unit FSU.

When the user applies external pressure to the touch switch portion TSW of the electronic device 10, the housing 500 is bent as illustrated in FIG. 11B, and the pressure is transferred to the board 620. Then, the board 620 and the force sensing unit FSU may descend from positions where the board 620 and the force sensing unit FSU are positioned before the external pressure is applied, and the metal portion 630, which is disposed between the force sensing unit FSU and the bracket 630, may be deformed so that an inclination of a curved surface of the head portion 651 is decreased. A distance between opposing support portions 653 may be increased.

As the metal portion 650 is deformed as described above, the size of the contact region between the force sensing unit FSU and the metal portion 650 may be increased. As a result, the size of the overlapping region between the metal portion 650 and the sensing coil 610 may be increased, the inductance of the sensing coil 610 may also be changed.

In addition, since the metal portion 650 descends as a whole when pressure is transferred to the head portion 651, the inductance change due to a decrease in distance between the metal portion 650 and the sensing coil 610 may occur at the same time.

Therefore, the inductance change in the sensing coil 610 may be induced as much as a change amount corresponding to the sum of the change of the position of the overlapping region between the sensing coil 610 and the metal portion 650, and the change of the distance between the metal portion 650 and the sensing coil 610. Therefore, the sensitivities of the touch sensing devices 600 and 600' may be improved.

Although only the metal portion 650 having a dome shape is illustrated in FIGS. 10 through 11B, this is only an example. Therefore, embodiments corresponding to FIGS. 10 through 11B may include all structures in which the metal portion 650 is partially in contact with each of the inner side surface of the FSU and the bracket 630. That is, the shape of the metal portion 650 is not limited to a specific shape, as long as the metal portion is deformed to be flattened when pressure is applied to the touch switch portion TSW of the electronic device 10. For example, the metal portion 650 may have an "N" shape, a "Z" shape, a "W" shape, or an "M" shape.

The touch sensing devices 200, 300, 400, and 600 are disposed to be in contact with the housing 500, and may further include a pad for sensing a capacitance change caused by an external contact on the touch switch portion TSW.

Examples in which the pad is added to the touch sensing devices 300 and 400 will be described below. The following description may also be applied to the touch sensing devices 200 and 600.

Figure 12:
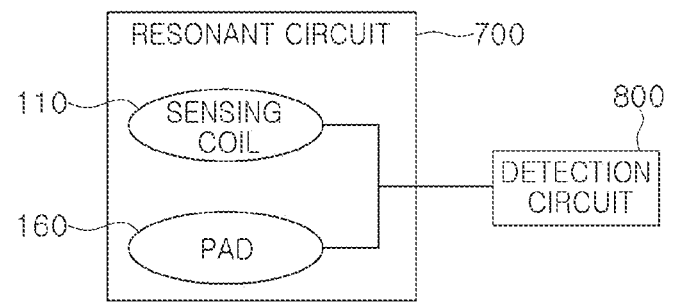
FIG. 12 is a diagram illustrating a connection structure of a circuit included in the touch sensing device of FIGS. 2A and 2B, according to an embodiment.
Figure 13:
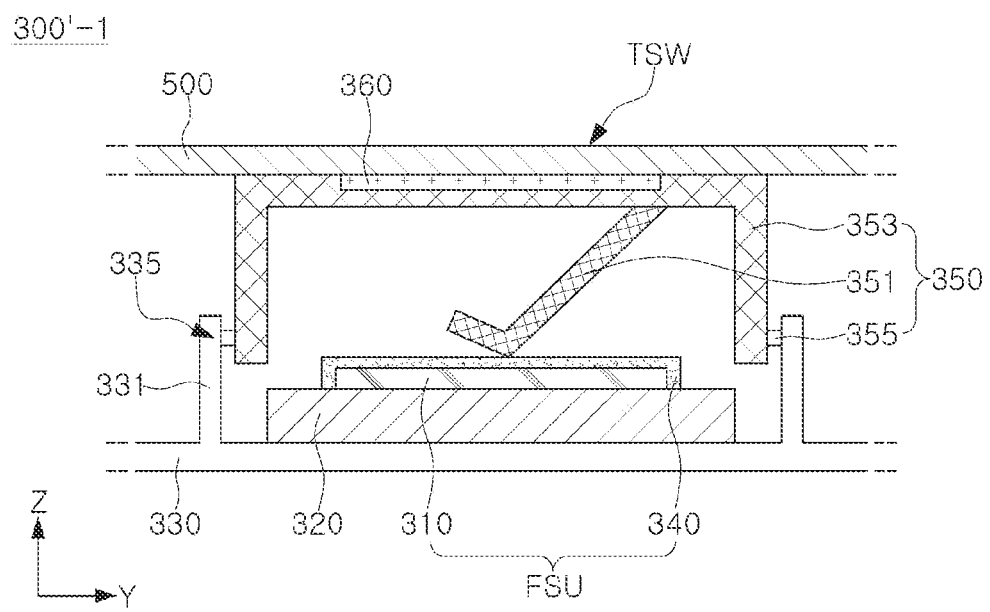
FIG. 13 is a front view in the Y-Z plane, illustrating an example in which a pad is added to the touch sensing device of FIGS. 7A and 7B.
Figure 14:
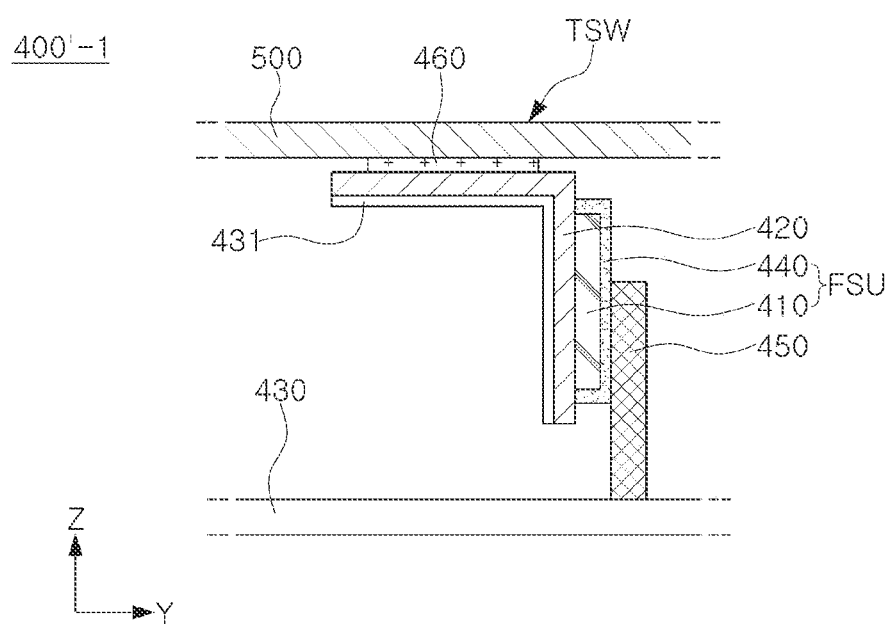
FIG. 14 is a front view in the Y-Z plane, illustrating an example in which a pad is added to the touch sensing device of FIGS. 9A and 9B.

FIG. 12 is a diagram illustrating a connection structure of a circuit included in the touch sensing device 100 of FIGS. 2A and 2B, according to an embodiment. FIG. 13 is a front view in a Y-Z plane, illustrating an example in which the pad is added to the touch sensing device 300' of FIGS. 7A and 7B. FIG. 14 is a front view in a Y-Z plane, illustrating an example in which the pad is added to the touch sensing device 400' of FIGS. 9A and 9B.

Referring to FIGS. 2 and 12, the touch sensing device 100 may further include a pad 160.

The pad 160 is a device configured to perform capacitive sensing in which a contact touch is sensed to generate an input signal. Therefore, with the touch sensing device 100 including both the sensing coil 110 and the pad 160, hybrid sensing in which inductive sensing and capacitive sensing are performed at the same time may be performed.

The pad 160 may be disposed to be in contact with the housing 500 of the electronic device 10, thereby detecting a capacitance change caused by an external contact on the touch switch portion TSW. That is, the pad 160 and the sensing coil 110 are disposed on the same vertical line, such that the force touch and the contact touch are sensed at the same time in one touch operation.

Referring to FIG. 12, the pad 160 and the sensing coil 110 may be electrically connected to each other to form a resonant circuit 700. Further, the resonant circuit 700 including the pad 160 and the sensing coil 110 may be connected to a detection circuit 800.

The resonant circuit 700 may generate a resonance signal having resonant frequency that is changed when a touch is applied. The change of the resonant frequency may be induced by the change of the inductance generated in the sensing coil 110, or the change of the resonant frequency may be induced by the change of the capacitance generated in the pad 160. Therefore, the resonant circuit 700 may generate a resonance signal of which the resonant frequency is changed when either one or both of the inductance and the capacitance is changed.

The resonance signal generated in the resonant circuit 700 may be transferred to the detection circuit 800. The detection circuit 800 may determine a position on which the touch is applied and external pressure intensity of the touch based on the change of the resonant frequency of the resonance signal. Further, the detection circuit 800 may generate a touch input signal based on the determined position and external pressure intensity.

For example, when the user applies a touch on the touch switch portion TSW, both a contact touch and a force touch that involves external pressure are generated.

In a case in which the resonance signal having a resonant frequency changed due to the capacitance change occurring in the pad 160 is generated, the detection circuit 800 may detect a position of the pad 160 at which the capacitance change occurs, to accurately identify a position on which the contact touch is applied. That is, in a case in which the electronic device includes a plurality of touch switch portions TSW, the detection circuit 800 may identify a touch switch portion TSW on which the user performs a touch operation.

Further, in a case in which the resonance signal having a resonant frequency changed due to the inductance change occurring in the sensing coil 110 is generated, the detection circuit 800 may detect an inductance change amount to identify an intensity of the force touch.

The detection circuit 800 may determine whether the intensity of the external pressure applied to the touch switch portion TSW exceeds a threshold, thereby identifying whether a normal touch input occurs. Further, in a case in which it is determined that a normal touch input is applied, the detection circuit 800 may generate a touch input signal.

However, the above-described method is only an example. The detection circuit 800 may generate a touch input signal through various determination processes according to disposition and connection between a plurality of sensing coils 110 and pads 160 included in the electronic device 10.

Referring to FIG. 13, a touch sensing device 300'-1 may include the force sensing unit FSU including the sensing coil 310, the board 320, the bracket 330, the metal portion 350, and a pad 360.

In order for the pad 360 to sense a contact touch, a touch applied to the touch switch portion TSW of the electronic device 10 needs to be transferred to the pad 360. Therefore, it is preferable that the pad 360 is disposed to be in direct contact with the housing 500 or is disposed close to the housing 500.

Further, the pad 360 and the sensing coil 310 may be positioned on the same vertical line. Therefore, external pressure applied to the touch switch portion TSW is transferred to both the pad 360 and the metal portion 350, such that the contact touch and the force touch may be sensed at the same time in one touch operation.

Referring to FIGS. 6 and 13, the opening portion 357 may be provided in the upper surface portion of the cover portion 353, and the pad 360 may be disposed on the upper surface portion of the cover portion 353 while covering the opening portion 357. In this case, the electric connection between the pad 360 and the sensing coil 310 may be facilitated.

A method of implementing the touch sensing device 300'-1 including both the sensing coil 310 and the pad 360 may vary.

For example, when a touch is applied to the touch switch portion TSW positioned over the pad 360, pressure may be transferred to the cover portion 353 and the metal portion 350 may descend as a whole. As the position of the contact region between the metal portion 350 and the force sensing unit FSU is changed due to deformation of the elastic portion 351 of the metal portion 350, the position of the overlapping region between the sensing coil 310 and the metal portion 350 may be changed. Then, the touch sensing device 300'-1 may detect a resonant frequency change caused by the inductance change in the sensing coil 310 and generate an input signal by the force touch.

When a contact medium is changed due to a touch applied to the touch switch portion TSW, the capacitance change may occur in the pad 360. Therefore, the touch sensing device 300'-1 may detect a resonant frequency change caused by the capacitance change in the pad 360 and generate an input signal by the contact touch.

Since the pad 360 for sensing the contact touch is added to the touch sensing device 300'-1, a position on which a touch operation is performed by the user on the housing 500 may be accurately identified. That is, when the capacitance change in the pad 360 is detected, the touch sensing device 300'-1 may recognize that a touch is applied to a touch switch portion TSW from which the change is detected.

Further, the inductance change occurring in the sensing coil 310 may be detected under the assumption that a touch is applied to the corresponding touch switch portion TSW, thereby determining an intensity of external pressure applied by the touch.

In other words, the touch sensing device 300'-1 may sense a position to which a touch is applied using capacitive sensing, and may sense pressure intensity of the touch by inductive sensing, thereby generating a touch input signal according to the sensed position and pressure intensity.

Referring to FIG. 14, a touch sensing device 400'-1 may include the force sensing unit FSU including the sensing coil 410, the board 420, the bracket 430, the metal portion 450, and a pad 460.

In order for the pad 460 to sense a contact touch, a touch applied to the touch switch portion TSW of the electronic device 10 needs to be transferred to the pad 460. Therefore, it is preferable that the pad 460 is disposed to be in direct contact with the housing 500 or is disposed close to the housing 500.

The pad 460 and the sensing coil 410 may be positioned on the same board 420. The sensing coil 410 may be disposed on the first surface 421 of the board 420, and the pad 460 may be disposed on the second surface 422, and thus the sensing coil 410 and the pad 460 may be arranged to extend perpendicular to each other.

A method of implementing the touch sensing device 400'-1 including both the sensing coil 410 and the pad 460 may vary.

For example, when a touch is applied to the touch switch portion TSW positioned over the pad 460, pressure may be transferred to the second surface 422 of the board 420 and the board 420 may descend as a whole. As the force sensing unit FSU, which is disposed on the first surface 421 of the board 420, descends, the size of the overlapping region between the sensing coil 410 and the metal portion 450 may be changed. Then, the touch sensing device 400'-1 may detect a resonant frequency change caused by the inductance change in the sensing coil 410, and may generate an input signal by the force touch.

When a contact medium is changed due to a touch applied to the touch switch portion TSW, the capacitance change may occur in the pad 460. Therefore, the touch sensing device 400'-1 may detect a resonant frequency change caused by the capacitance change in the pad 460, and may generate an input signal by the contact touch.

Since the pad 460 that senses the contact touch is added to the touch sensing device 400'-1, a position on which a touch operation is performed by the user on the housing 500 may be accurately identified. That is, when the capacitance change in the pad 460 is detected, the touch sensing device 400'-1 may recognize that a touch is applied to a touch switch portion TSW from which the change is detected.

Further, the inductance change occurring in the sensing coil 410 may be detected under the assumption that a touch is applied to the corresponding touch switch portion TSW, thereby determining an intensity of external pressure applied by the touch.

In other words, the touch sensing device 400'-1 may sense a position to which a touch is applied using capacitive sensing, and sense pressure intensity of the touch by inductive sensing, thereby generating a touch input signal according to the sensed position and pressure intensity.

Figure 15:
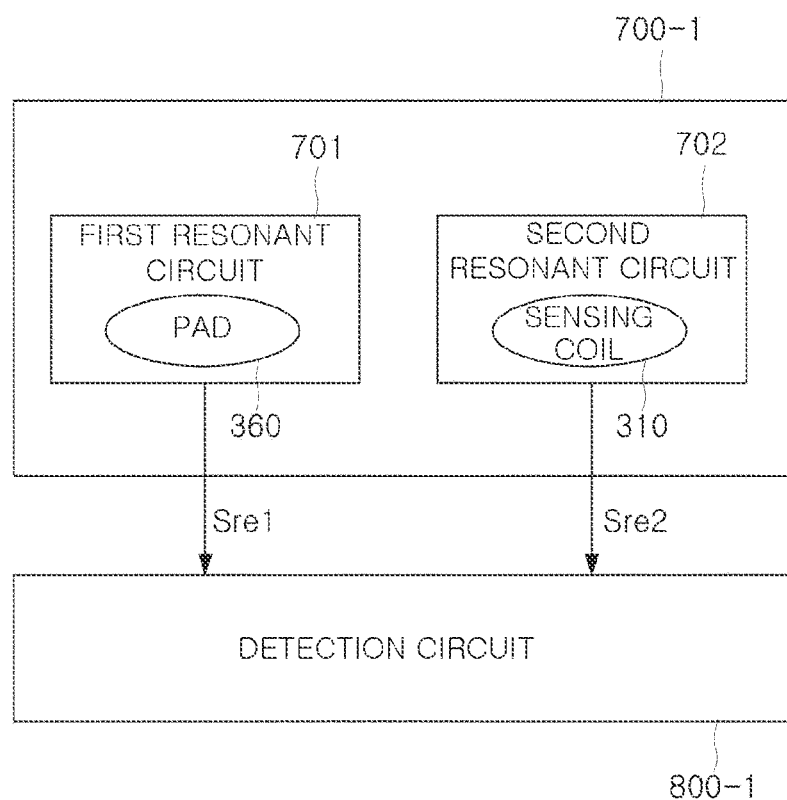
FIG. 15 is a diagram illustrating a connection structure of a circuit included in the touch sensing device of FIG. 13, according to another embodiment.

FIG. 15 is a diagram illustrating a connection structure of a circuit included in the touch sensing device 300'-1, according to another embodiment.

Referring to FIGS. 13 and 15, a resonant circuit 700-1 may include a first resonant circuit 701 and a second resonant circuit 702. The pad 360 may form the first resonant circuit 701, and the sensing coil 310 may form the second resonant circuit 702. That is, the pad 360 and the sensing coil 310 included in one touch sensing device may form different resonant circuits, separate from each other.

In addition, the first resonant circuit 701 and the second resonant circuit 702 may respectively be connected to a detection circuit 800-1. This disclosure only specifically describes a structure in which the first resonant circuit 701 and the second resonant circuit 702 are connected to one detection circuit 800-1. However, this disclosure is not limited to such a configuration, and a structure in which the first resonant circuit 701 and the second resonant circuit 702 are each connected to a separate detection circuit is possible.

The first resonant circuit 701 may generate a first resonance signal Sre1 having a resonant frequency that varies as a touch is applied. That is, when a change in capacitance occurs in the pad 360 as a touch is applied, a change in resonant frequency may be induced in the first resonant circuit 701, accordingly. Then, the first resonance signal Sre1 may be generated based on changing resonant frequency.

The second resonant circuit 702 may generate a second resonance signal Sre2 having a resonant frequency that varies as a touch is applied. That is, when a change in inductance occurs in the sensing coil 310 (FIG. 13) as a touch is applied, a change in resonant frequency may be induced in the second resonant circuit 702, accordingly. Then, the second resonance signal Sre2 may be generated based on changing resonant frequency.

The first and second resonance signals Sre1 and Sre2, respectively generated by the first and second resonant circuits 701 and 702, may be transmitted to the detection circuit 800-1. The detection circuit 800-1 is electrically connected to the first and second resonant circuits 701 and 702, and may generate a touch input signal based on an amount of change in the resonant frequency of the generated first and second resonance signals Sre1 and Sre2.

In more detail, the detection circuit 800-1 may be electrically connected to the first resonant circuit 701. Further, the detection circuit 800-1 recognizes a contact touch applied to the pad 360 (FIG. 13) based on the amount of change in the resonant frequency of the first resonance signal Sre1 generated in the first resonant circuit 701, and may generate a contact touch input signal accordingly.

Also, the detection circuit 800-1 may be electrically connected to the second resonant circuit 702. Further, the detection circuit 800-1 recognizes a contact touch applied to the sensing coil 310 (FIG. 13) based on the amount of change in the resonant frequency of the second resonance signal Sre2 generated in the second resonant circuit 702, and may generate a contact touch input signal accordingly.

In other words, when one touch is applied to the touch switch portion TSW (FIG. 13) by a user, the touch may act as a contact touch on the pad 360 (FIG. 13), and may act as a force touch on the sensing coil 310 (FIG. 13). In addition, each of the contact touch and the force touch may generate separate touch input signals, that is, a contact touch input signal and a force touch input signal, respectively, by the detection circuit 800-1.

A portion of the first resonant circuit 701, a portion of the second resonant circuit 702, and the detection circuit 800-1 may be included in a sensor integrated circuit (IC). A plurality of capacitors may be provided in the sensor IC, and each of the capacitors may constitute a portion of a separate resonant circuit.

For example, the first resonant circuit 701 may include the pad 360, and may further include a separate inductor, and one capacitor included in the sensor IC. In this case, a separate inductor may be implemented in various ways. As an example, the separate inductor may be implemented as a chip inductor in the touch sensing device.

The chip inductor, and the one capacitor included in the sensor IC may act as a resonator for generating a resonance signal, and is connected to the pad 360 (FIG. 13), to generate a first resonance signal, based on an amount of change in the resonant frequency according to a capacitance change of the pad 360.

For example, the second resonant circuit 702 includes the sensing coil 310, and may further include a capacitor included in the sensor IC. The sensing coil 310 and the capacitor included in the sensor IC may act as a resonator generating a resonance signal, and may generate a second resonance signal based on the amount of change in the resonant frequency according to an inductance change of the sensing coil 310.

However, the configuration of the resonant circuit, described above, is only illustrative, and the resonant circuit may be configured in various ways and connected to the detection circuit 800-1. In addition, a configuration of the sensor IC may also be modified in various ways.

As set forth above, according to embodiments disclosed herein, a space required to implement a force sensor is reduced, such that a limited space in an electronic device may be efficiently utilized.

Further, sensitivity for a force touch input may be improved.

Further, hybrid sensing in which a force touch input and a contact touch input may be sensed at the same time in one touch operation may be performed.

Further, even in a case in which a housing of the electronic device is not formed of a metal material, a metal portion is provided in a touch sensing device installed in the electronic device, such that the function of the force sensor may be performed.

Further, a touch sensing device that is suitable for the internal structure of each of different electronic devices may be selectively used.

Further, as the touch sensing devices are separated individually, signals are separated. As a result, malfunction occurring among different touch sensing devices may be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing device, comprising:
    a force sensing unit including a sensing coil; and
    a metal portion,
   wherein at least a portion of the metal portion is in contact with the force sensing unit, and the touch sensing device is configured such that a region of the metal portion overlapping with the sensing coil changes in response to a touch being applied to the touch sensing device.

2. The touch sensing device of claim 1, wherein either one or both of a position and a size of a contact region between the metal portion and the force sensing unit is changed in response to the touch being applied.

3. The touch sensing device of claim 2, wherein the metal portion is configured to be deformed according to pressure intensity of an applied touch.

4. The touch sensing device of claim 3, further comprising:
    a board having a space in which the sensing coil is disposed; and
    a bracket supporting the board and the metal portion.

5. The touch sensing device of claim 4, wherein at least one end of the metal portion is connected to the bracket, another end of the metal portion is in contact with the force sensing unit, and the other end of the metal portion is configured to move in a horizontal direction on one surface of the force sensing unit, in response to the touch being applied.

6. The touch sensing device of claim 4, wherein the metal portion includes:
    an inclined portion connected to the bracket and having a predetermined inclination with respect to the board;
    a pressing portion connected to the inclined portion and protruding in a direction away from the sensing coil; and
    a contact portion connected to the pressing portion and disposed in contact with one surface of the force sensing unit.

7. The touch sensing device of claim 4, wherein the metal portion includes:
    a cover portion disposed to be spaced apart from the sensing coil and configured to move toward the sensing coil in response to the touch being applied;
    a plurality of protruding portions protruding from opposite sides of the cover portion and coupled to the bracket; and
    an elastic portion including one end connected to the cover portion, and another end disposed in contact with the force sensing unit, and
    wherein the touch sensing device is configured such that a position of a region of the elastic portion in contact with the force sensing unit changes in response to the cover portion moving.

8. The touch sensing device of claim 4, wherein the metal portion includes:
    a plurality of support portions disposed in contact with the bracket, and configured to move on the bracket in response to the touch being applied; and
    a head portion disposed between the plurality of support portions, and disposed in contact with the force sensing unit, and
    wherein the touch sensing device is configured such that a size of a region of the head portion in contact with the force sensing unit changes in response to the support portions moving.

9. The touch sensing device of claim 2, wherein the force sensing unit is configured to move in a direction in which a touch is applied, according to pressure intensity of the applied touch.

10. The touch sensing device of claim 9, further comprising:
    a board having a first surface on which the force sensing unit is disposed and a second surface perpendicular to the first surface; and
    a bracket supporting the board,
    wherein the metal portion is disposed parallel to the first surface, and the touch sensing device is configured such that a size of the region of the metal portion overlapping with the sensing coil changes in response to the force sensing unit moving.

11. The touch sensing device of claim 1, wherein the force sensing unit further includes a protection member disposed to cover the sensing coil and having one surface in contact with the metal portion.

12. The touch sensing device of claim 1, further comprising a pad disposed to contact a housing and configured to sense a change in capacitance in response to an external contact being applied to the touch switch.

13. The touch sensing device of claim 12, wherein the pad forms a first resonant circuit, and the sensing coil forms a second resonant circuit, and
wherein the first and second resonant circuits are configured to generate first and second resonance signals, respectively, having first and second resonant frequencies, respectively, changing in response to the touch being applied.

14. The touch sensing device of claim 13, further comprising a detection circuit electrically connected to the first resonant circuit and the second resonant circuit,
wherein the detection circuit is configured to generate a contact touch input signal based on an amount of change in resonant frequency of the first resonance signal, and generate a force touch input signal based on an amount of change in resonant frequency of the second resonance signal.

15. An electronic device, comprising:
a housing including a touch switch portion; and
a touch sensing device configured to sense either one or both of a force touch and a contact touch, in response to a touch being applied to the touch switch portion,
wherein the touch sensing device includes:
a force sensing unit including a sensing coil;
a metal portion, at least a portion of the metal portion being in contact with the force sensing unit, and the touch sensing device being configured such that a region of the metal portion overlapping the sensing coil changes in response to the touch being applied to the touch switch portion; and
a bracket disposed to be spaced apart from the housing, and supporting the force sensing unit and the metal portion such that the metal portion is disposed between the housing and the bracket.

16. The electronic device of claim 15, wherein the metal portion configured to be deformed by pressure of the applied touch being transferred from the housing, and
wherein the touch sensing device is configured such that either one or both of a position and a size of a contact region between the metal portion and the force sensing unit is changed by the pressure of the applied touch.

17. The electronic device of claim 16, wherein one region of the metal portion is in contact with the housing, another region of the metal portion is in contact with the force sensing unit, and the other region of the metal portion is configured to move in a horizontal direction on one surface of the force sensing unit, in response to the pressure of the applied touch being transferred to the one region.

18. The electronic device of claim 16, wherein the metal portion includes:
a pressing portion protruding to be in contact with the housing, and configured to be deformed by the pressure of the applied touch being transferred from the housing;
an inclined portion having opposite ends connected to one end of the pressing portion and the bracket, respectively, and configured to have an inclination changed in response to the pressing portion being deformed; and
a contact portion having one end connected to the other end of the pressing portion, having another end disposed in contact with the force sensing unit, and configured to move in a horizontal direction on one surface of the force sensing unit in response to the pressing portion being deformed.

19. The electronic device of claim 16, wherein the metal portion includes:
a cover portion having an upper surface portion that is in contact with the housing, and side surface portions extending on opposite sides of the upper surface portion in a vertical direction, and configured to descend due to the pressure of the applied touch being transferred from the housing;
a plurality of protruding portions protruding from the side surface portions of the cover portion and coupled to the bracket; and
an elastic portion having one end connected to the upper surface portion, another end in contact with the force sensing unit, and
wherein the touch sensing device is further configured such that a position of a region of the elastic portion that is in contact with the force sensing unit changes in response to the cover portion descending.

20. The electronic device of claim 16, wherein the force sensing unit is disposed between the housing and the metal portion, and
wherein the touch sensing device is further configured such that the size of the contact region between the metal portion and force sensing unit changes in response to the pressure of the applied touch being transferred from the housing to the force sensing unit.

21. The electronic device of claim 16, wherein the touch sensing device further includes a board having a first surface on which the force sensing unit is disposed and disposed perpendicular to the housing, and a second surface in contact with the housing and disposed parallel to the housing,
wherein the metal portion is disposed parallel to the first surface of the board, and
wherein the touch sensing device is further configured such that a size of an overlapping region between the force sensing unit and the metal portion changes in response to the board descending due to the pressure of the applied touch being transferred from the housing.

22. The electronic device of claim 15, wherein the touch sensing device further includes a pad in contact with the housing, and configured to sense a capacitance change caused by an external contact on the touch switch portion.

23. The electronic device of claim 22, wherein the pad and the sensing coil are disposed on a same board, and are connected to each other to form a resonant circuit.

24. The electronic device of claim 22, wherein the pad forms a first resonant circuit, and the sensing coil forms a second resonant circuit, and
wherein the first and second resonant circuits are configured to generate first and second resonance signals, respectively, having first and second resonant frequencies, respectively, changing in response to the touch being applied.

25. The electronic device of claim 24, further comprising a detection circuit electrically connected to the first resonant circuit and the second resonant circuit,
wherein the detection circuit is configured to generate a contact touch input signal based on an amount of change in resonant frequency of the first resonance signal, and generate a force touch input signal based on an amount of change in resonant frequency of the second resonance signal.

26. A touch sensing device, comprising:
a force sensing unit including a sensing coil; and
a conductive member configured to deform, in response to a touch being applied to the touch sensing device, such that the conductive member moves in a first direction perpendicular to a sensing surface of the force sensing unit, and a second direction parallel to the sensing surface.

27. The touch sensing device of claim 26, wherein the conductive member comprises:
a pressing portion configured to be move in the first direction, in response to pressure transferred from the applied touch; and
a contact portion in contact with the sensing surface and configured to move in the second direction on the sensing surface, in response to the pressing portion moving in the first direction.

28. The touch sensing device of claim 26, wherein the contact portion is disposed at one end of the conductive member, and the conductive member further comprises an inclined portion connecting the contact portion to the pressing portion.

29. The touch sensing device of claim 26, wherein the touch sensing device is configured such that a region in which the conductive portion and the force sensing unit overlap changes due to the deforming of the conductive member.

30. An electronic device, comprising:
a housing including a touch switch portion; and
a touch sensing device configured to sense a touch applied to the touch switch portion,
wherein the touch sensing device includes:
a bracket disposed inside the housing;
a force sensing unit disposed on the bracket, inside the housing, and including a sensing coil; and
a conductive member disposed inside the housing and configured to deform, in response to the applied touch, such that the conductive member moves in a first direction perpendicular to a sensing surface of the force sensing unit, and a second direction parallel to the sensing surface.

31. The electronic device of claim 30, wherein the conductive member comprises:
a pressing portion configured to be contacted by the housing and move in the first direction, in response to pressure transferred through the housing from the applied touch; and
a contact portion in contact with the sensing surface and configured to move in the second direction on the sensing surface, in response to the pressing portion moving in the first direction.

32. The electronic device of claim 30, wherein the contact portion is disposed at one end portion of the conductive member,
wherein another end portion of the conductive member is fixed on a surface of the bracket.

33. The electronic device of claim 30, wherein the conductive member comprises:
a cover portion including an upper portion configured to be contacted by the housing to move the cover portion in the first direction, in response to pressure transferred through the housing from the applied touch, and side portions movably coupled to extended portions of the bracket; and
an elastic portion having a first end connected to the cover portion, and a second end in contact with the sensing surface, the second end being configured to move in the second direction along the sensing surface, in response to the cover portion moving in the first direction.

* * * * *